(12) United States Patent
Maranzana et al.

(10) Patent No.: US 11,886,493 B2
(45) Date of Patent: Jan. 30, 2024

(54) METHOD AND SYSTEM FOR DISPLAYING 3D MODELS

(71) Applicant: 7893159 Canada Inc., Montreal (CA)

(72) Inventors: Roland Maranzana, Montreal (CA); Omar Msaaf, Montreal (CA)

(73) Assignee: 7893159 CANADA INC., Montreal (CA)

( * ) Notice: Subject to any disclaimer, the term of this patent is extended or adjusted under 35 U.S.C. 154(b) by 47 days.

(21) Appl. No.: 17/077,054

(22) Filed: Oct. 22, 2020

(65) Prior Publication Data

US 2021/0248836 A1     Aug. 12, 2021

Related U.S. Application Data

(63) Continuation-in-part of application No. 16/013,479, filed on Jun. 20, 2018, now Pat. No. 11,010,593.
(Continued)

(51) Int. Cl.
*G06F 16/583* (2019.01)
*G06T 19/20* (2011.01)
(Continued)

(52) U.S. Cl.
CPC .......... *G06F 16/5854* (2019.01); *G06F 30/10* (2020.01); *G06T 19/20* (2013.01); *G06V 20/653* (2022.01); *G06T 2219/2004* (2013.01)

(58) Field of Classification Search
CPC .... G06F 16/5854; G06F 16/587; G06F 30/10; G06F 30/12; G06F 30/17; G06T 19/20; G06T 2219/2004; G06T 2219/2016
See application file for complete search history.

(56) References Cited

U.S. PATENT DOCUMENTS 6,625,607 B1   9/2003  Gear
7,149,677 B2   12/2006 Jayaram et al.
(Continued)

FOREIGN PATENT DOCUMENTS

EP          2284770       2/2011
JP          2000222428    8/2000
(Continued)

OTHER PUBLICATIONS

Kolonias, I. et al.; "Fast Content-Based Search of VRML Models Based on Shape Descriptors", IEEE Transactions on Multimedia, vol. 7, No. 1, Feb. 2005.
(Continued)

*Primary Examiner* — Ruiping Li
(74) *Attorney, Agent, or Firm* — Brouillette Legal Inc.; Robert Brouillette

(57) ABSTRACT

A method is disclosed for indexing 3D digital models, retrieving them, comparing them and displaying the results in a 3D space. The method comprises four complementary parts, i.e. displaying, comparing/searching, reconciling the faces, and classifying the results. These parts can overlap with each other or can be implemented separately. A method is described for retrieving 3D models that share certain similarities of form with a reference 3D model, involving a first step of analysis in order to generate representations (descriptors). The process of searching/comparing 3D models based on descriptors partially related to the faces optionally requires a process of pairing and reconciling the faces. The results are displayed in a single 3-dimensional space and, owing to a mark on the faces of the 3D models, makes it possible to distinguish several types of difference between similar 3D models.

11 Claims, 9 Drawing Sheets

Related U.S. Application Data which is a continuation-in-part of application No. 15/104,887, filed as application No. PCT/IB2014/066870 on Dec. 12, 2014, now abandoned.

(60) Provisional application No. 61/916,279, filed on Dec. 15, 2013.

(51) Int. Cl.
*G06F 30/10* (2020.01)
*G06V 20/64* (2022.01)

(56) References Cited

U.S. PATENT DOCUMENTS

| | | |
|---|---|---|
| 8,072,450 B2 | 12/2011 | Chang et al. |
| 2004/0249809 A1 | 12/2004 | Ramani et al. |
| 2005/0276443 A1 | 12/2005 | Slamani et al. |
| 2009/0040225 A1 | 2/2009 | Wang et al. |
| 2009/0110297 A1* | 4/2009 | Endo ............... G06T 7/001 382/218 |
| 2010/0073365 A1 | 3/2010 | Racaniere |
| 2013/0080045 A1 | 3/2013 | Ma et al. |

FOREIGN PATENT DOCUMENTS

| | | |
|---|---|---|
| JP | 2001307111 | 11/2001 |
| JP | 2004288170 | 10/2004 |
| JP | 2012043419 | 3/2012 |
| WO | WO2007098929 | 9/2007 |
| WO | WO2013044484 | 4/2013 |

OTHER PUBLICATIONS

Min, P. et al.; "A Search Engine for 3D Models", Princeton University and NEC Research Institute, ACM Transactions on Graphics, vol. V, No. N, 10 202002.

Lai, J.-Y. et al.; "G2 Continuity for Multiple Surfaces Fitting", Int J Adv Manuf Technol (2001) 17:575-585, Springer-Verlag London Limited.

Preliminary Notice of Rejection issue by the Japanese Patent Office, in the corresponding patent application No. 2017-504108, dated Apr. 12, 2019 under JP 6508733.

Extended European Search Report dated Jul. 12, 2017, in the corresponding european patent application No. 1486994.2.

International Search Report dated May 22, 2015, in the corresponding International patent application No. PCT/IBN2014/066870.

* cited by examiner

METHOD AND SYSTEM FOR DISPLAYING 3D MODELS

CROSS-REFERENCE TO RELATED APPLICATIONS

The present patent application is a continuation-in-part of U.S. patent application Ser. No. 16/013,479, entitled "Method and System for Comparing 3D Models", and filed at the United States Patent and Trademark Office on Jun. 20, 2018, which is a continuation-in-part of U.S. patent national phase application Ser. No. 15/104,887, entitled "Method and System for Comparing 3D Models", and filed at the United States Patent and Trademark Office on Jun. 15, 2016 based on PCT/IB2014/066870 filed on Dec. 12, 2014 and claims the benefits of priority of U.S. Provisional Patent Application No. 61/916,279, entitled "Method and System for Comparing 3D Models", and filed at the United States Patent and Trademark Office on Dec. 15, 2013, the content of which is incorporated herein by reference.

FIELD OF THE INVENTION

This patent application relates to the field of 3D models, as an example to the digital representations in a space of dimension 3, and more particularly to the field of displaying 3D models.

BACKGROUND OF THE INVENTION

Tri-dimensional (3D) digital representations of objects are well-known in the fields of engineering, medicine, video game, film, and even in widely spread applications (for example SketchUp by Google, now Trimble). Their usage in such fields was made possible by 3D authoring and editing software including CAD systems (Computer-Aided Design), by reverse engineering applications and by other techniques of 3D reconstruction (topological optimisation for example), and also by 3D scanning equipment. All these means generate digital models in dimension 3. All of the said digital models are 3D models describing boundaries between objects and their environment. Some of these 3D models are known as Boundary Representations (B-rep, as for example in the STEP standard or geometric modelers like Parasolid and Acis). Others provide a tessellation (for example STL or VRML formats). These 3D models may include information other than purely geometrical data.

The above types of 3D models are commonly used in enterprises and in many areas of everyday life, and their number are still quickly increasing. Therefore, a multi-facet problem is arising, i.e. (i) to identify the 3D models, (ii) to find similar digital objects, (iii) to compare them to identify differences or identical parts, and finally (iv) to display relevant results according to a set of criteria to ensure simple and efficient use of the search results.

Currently, there are two distinct categories of systems. Systems belonging to the first category compare a first 3D model to a second 3D model to determine the differences between them. Systems from the second category find 3D models that are similar to a 3D model given in reference.

3D Models Comparison Systems

Several dedicated computer applications or included in CAD systems offer methods to compare precisely two 3D models or a 3D model with a cloud of points or a 3D model reconstructed from a real object. In this approach, the two compared 3D models have to be selected. Several distinct methods to compare these two 3D models exist. Topological and geometric structures comparison based on graphs analysis approaches (Graph mapping, such as for example WO 2007/098929 A1) are usually proposed when the two 3D models are B-Reps. Methods based on points sampling or point clouds (like for example, U.S. Pat. No. 7,149,677 B2, or by the method of least squares as in the product of Innovmetric or U.S. Pat. No. 8,072,450 B2) are also very common. Sometime these methods require the two 3D models to be in the same coordinate system before the comparison can take place, or to be in the same computer application (same CAD system, for example), and use the same geometrical representation. Methods based on a comparison at the geometrical and topological levels imperatively require the two compared 3D models to meet these conditions or the two 3D models are converted in a common topological and geometric graph data structure, a kind of neutral B-Rep format. Depending on the comparison method used, the marking of the 3D models distinguishes identical and different parts by associating a state to the said marking (identical, modified, unique) or even by quantifying the differences between the two 3D models (a distance between points of models A and B, respectively, for example). The results of the comparison of the two 3D models are then displayed, either (i) by superimposing them, (ii) by applying a gradation of color to highlight the difference between the vectors fields of the models A and B, or (iii) a color code according to the state defined in the previous module. This comparison indicates the identical parts of the 3D model, the unpaired parts, the modified ones, and possibly parts added to one model and thus missing in the other. This is why a symmetrical display is used to display what exists in A and not in B and what exists on in B and not in A. Although all of these systems are different, they all share the same constraint: when they compare the reference 3D model with the target 3D model, they choose a single coordinate system or a single 'best fit' to compare the complete 3D models to show differences. For example, the application of Geometric Ltd. included in SolidWorks™ and 3DAnalyzer of CoreTechnologie are typical and representative examples of this category. Most of these 3D models comparison systems focus on CAD models and mechanical parts. It should be noted that none of these processes extract a descriptor, which prevent them to perform searches based on shape. Moreover, none of these processes includes steps to perform searches in a database. They directly use the data structure of the B-Reps of the two 3D models if they are of the same type (as for example Parasolid in Solidworks) or convert the two B-Reps of different types in the same topological and geometric graph type data structure to make the comparison. These processes are not suitable for determining an index of similarity between two shapes nor to search similar 3D models because the comparison time between a reference 3D model and a large number of target 3D models grows very rapidly and is not usable in interactive shape search applications for example.

3D Shape Search Systems

A second category of applications aims at finding 3D models by comparing a reference 3D model with a set of 3D models to order the said 3D models based on their similarity to the reference 3D model. The found similarity is usually expressed with a quantitative value used to order these 3D models. Various methods are available to compute the similarity. At first, an analysis of each 3D model generates a representation used to carry out effectively later comparisons. In this case, this representation is often referred to in various terms, including descriptor, representation, and index. Whatever the name, the representation may take several forms, such as a graph (US 2004/0249809 A1), a vector of predefined dimension N (U.S. Pat. No. 6,625,607 B1) or variable depending on the 3D model, etc. Replacing the 3D model with a set of 2D images or projections is a very common approach. For example, Papadakis (EP 2284770) describes a process using cylindrical projections, called panoramic views of the outer envelope of the object. Then he uses 2D Discrete Fourier Transform and 2D Discrete Wavelet Transform. This process therefore involves a first approximation by moving the 3D model from a space of dimension 3 with real numbers to a space of dimension 2 with integer numbers (images, pixels) and a second approximation then sampling by using discrete Fourier transformations to construct the descriptor. The process described by Ramani (US20040249809) is another example that illustrates the shape search process of similar 3D models. The transformation of the B-Rep from the 3D model into voxels is a rough approximation (the object is now represented by a bunch of small cubes). This intermediate representation is used to build a skeleton graph. This graph represents a simplification of the overall shape of the object and all the details have been lost. These two examples are representative of the methods found in the prior art used to carry out the shape search process. All these processes use approximation, simplification and sampling to construct a descriptor with a reduced size and which allows to compute efficiently a similarity index afterwards. Descriptors used in shape search processes are also independent of the coordinate system, i.e. they have the rotation invariance property because this property is needed to retrieve similar 3D models regardless of their position in the coordinate system. The descriptors of the 3D models are usually saved to speed up the execution of the comparisons. A 3D model is chosen as a reference for the search. In some cases, the reference 3D model is replaced by images, photographs or two dimensions drawings [A 3D Model Search Engine, Patrick Min, Ph.d. Dissertation, Princeton University, 2004]. If necessary, the descriptor is calculated or provided (EP 2284770). All the descriptors found in the prior art, be it graphs, skeletons, sets of points, voxels, wavelets, spherical harmonics, sets of 2D images, planar, cylindrical or spherical projections of the form, do not capture all the details of the 3D model they represent. These descriptors represent rather the overall shape of the 3D model, and this is well adapted with the need to efficiently find other similar but will prevent them from performing a detailed analysis since the details have been lost at the very beginning of their process. For example, these methods do not provide the ability to show differences or similarities between 3D models or to determine if there are identical 3D models. Descriptors are used to compute a similarity value. Here again several methods are described in [Content-based three-dimensional Engineering Shape Search, K. Lou, S. Prabhakar, K. Ramani, Proceedings of the 20th International Conference on Data Engineering 2004]. All the methods proposed in the prior art for comparing descriptors in order to find similar 3D models have in common that they determine a value to characterize the similarity between the reference descriptor and a target descriptor. Based on the results of the comparison, similar 3D models are generally ordered on the basis of that quantity referred to as an index of similarity. These results are then displayed in various forms, usually images of small sizes (icons, miniature) of the 3D models.

As mentioned earlier, many approaches have been proposed to search for 3D models based on the shape of a reference 3D model. Some approaches focus on organic type shapes; others seek a permissive similarity (e.g. find cars, chairs, glasses). In particular, all processes proposed in the prior art are not designed to determine whether two 3D models are exactly the same, using a precision that is of the same order of magnitude as the manufacturing tolerances. Systems such as Siemens Geolus or Cadenas GeoSearch are representative of this category. Their processes start by analyzing 3D models approximated by a tessellated representation of the original 3D model to generate descriptors or a sampling of points of the boundary is used (US20100073365), therefore deteriorating the precision of the comparison. Moreover, several other methods propose to extract the descriptors from the 3D models and to compare them, require a high computing time and are therefore not applicable when the number of 3D models to process are important (more than a million of models, for example) or for interactive search Moreover, these approaches search for 3D models similar to the complete reference 3D model. Known 3D models search tools or systems have neither the information (descriptor) nor the technology to perform a search based on parts of 3D models or that favor parts of these 3D models during the search process.

In summary, in the prior art, making detailed comparison of two 3D models to detect differences and make a 3D shape search to find similar 3D models are treated as two totally different and distinct problems. As a result, two completely different and distinct categories of processes have been proposed to solve them. The processes of the 3D models comparison systems do not require a descriptor that is necessary to the 3D Shape search systems. The descriptors used by the 3D shape search systems suffer from severe limitations, due to approximations, sampling or simplifications which lead to a definitive loss of information and therefore do not permit to conduct detailed comparison of the 3D models to identify differences. The algorithms used by the 3D Shape search systems compute a global unique similarity value between a reference descriptor and a target descriptor. That value cannot be used to identify the usual plurality of differences between the two 3D models. On the other hand, the methods used by the 3D models comparison systems to identify the differences between two 3D models do not define a similarity index between these two 3D models. Finally, even the presentation of the results is totally different for the two categories of processes. In one case, a kind of marking highlights the differences between two 3D models. In the other case, several 3D models usually represented by pictures are ordered, according to their similarity index.

SUMMARY OF THE INVENTION

There is a need for systems to search for digital 3D models from heterogeneous sources and which are similar in whole or in part. Such systems should determine and describe the differences from a 3D reference model considered in its entirety or in part, and it should display the results with any relevant information on the found differences and similarities. Such systems should provide extremely high precision according to different criteria and should be adapted to deal with very large number of 3D models.

To meet these needs, a method is proposed, the said method is configured to initially build descriptors to identify (or index) 3D models. The built descriptor has the ability to capture properties at the level of, a complete 3D model, each solid body (in the usual sense of three-dimensional geometric and topological representation) composing a 3D model and also properties at the level of each face (always within the usual meaning of three-dimensional geometric and topological representation) forming the 3D model. Boundary representations do not guarantee the uniqueness of representation of a 3D model, that is, multiple boundary representations may correspond to the same object. To obtain such property which is essential to the comparison of 3D models, faces that are G2 continuous (geometric second derivative) along one of their common edge are regrouped and faces built on surfaces which are not G2 continuous are divided if required. All subsequent steps of the method, except displaying in 3D, may be applied to the descriptors without having to necessarily use 3D models.

The method further comprises comparing the characteristics of the descriptors based on criteria selected by the operator. The said step is based on two elements, the reconciliation of the terms or features of the descriptors and a more rigorous qualification of the differences applied at the level of parts of the 3D models, i.e. solid bodies and faces. The said reconciliation corresponds to achieving a pairing of solid bodies and faces of the 3D models which thus may be expressed in different coordinate systems, in different CAD systems, and in different geometric and topological representations. Such pairing allows taking into account only parts of 3D models for processing. Current methods are typically limited to the following characterizations: identical, modified or new. Up to nine characterizations may be used (such as identical, intrinsically identical, identical geometric type, different topology, etc.). A portion of a 3D model, a solid body or a face may simultaneously possess a plurality of characterizations. The marking for the display relies on these properties (for example, a color associated with a combination of qualifications) and the criteria in the query of the operator. A function based on the differences determines the index of similarity (or similarity) to order the 3D models.

As the handled digital objects are 3D models, a new way of communicating the results in the form of a 3D structure (Scene) in a single 3D space is proposed. As a result, if one 3D model is rotated, all the other 3D models can be automatically similarly rotated without the need to individually rotate each of the other 3D models.

One of the axes represent the similarity value wherein the marking (colors, etc.) of the faces are used to show the types of difference and the two other axes are used to represent other quantities or properties such as for example, costs, dates, suppliers, configurations, versions, etc.

In a first aspect of the invention, there is provided a computer implemented method to display a reference 3D model and more than two other 3D models in the form of a single 3D scene, which scene includes the reference 3D model and a plurality of the more than two other 3D models, the method comprising selecting 3D models to be displayed according to the one or more inputted criteria, constraining spatial positioning of the other 3D models with regard to the reference 3D model in the 3D scene according to the one or more inputted criteria and displaying the 3D models resulting from the comparison on a display unit, wherein only the 3D models meeting the one or more inputted criteria are displayed.

In a second aspect of the invention, the method may further comprise the step of constraining the marking of the other 3D models with regard to the reference 3D model in the 3D scene according to the one or more inputted criteria.

In a third aspect of the invention, the method may further comprise the step of displaying at least a portion of the differences identified in the comparison between the reference 3D model and a plurality of other 3D models at least on one of the 3D models.

In a fourth aspect of the invention, the method may further comprise the step of displaying at least a portion of the similarities identified in the comparison between the reference 3D model and a plurality of other 3D models at least on one of the 3D models.

In a fifth aspect of the invention, the method may further comprise the step of representing one or a plurality of other information as a spatial arrangement and/or a marking of one or more 3D models from the plurality of other 3D models.

In a sixth aspect of the invention, the method may further comprise the step of displaying on a display unit using marked faces the other 3D models in comparison to the reference 3D model, each marking identifying the similarities and/or the differences between more than two 3D models.

As an example, the method comprises (i) identifying 3D models identical to a reference 3D model with an accuracy comparable to that of the manufacturing's process precision of said object (identification of duplicates or geometric clones); (ii) identifying a part (a solid body) identical or similar in a mechanical system (a 3D model); (iii) identifying a component (set of solid bodies) identical or similar in a system or several systems (3D models); (iv) identifying similar 3D models in large optionally distributed databases of 3D models; etc.

Thanks to the descriptors that capture properties with a very fine granularity (set of parameters or characteristics at the level of each face) and capabilities of the comparator, including the principles of reconciliation and qualification of the faces, the system may also identify and recognize form features, i.e. parts of 3D models. As an example, the system may be configured to identify (i) a set of through holes with given diameter and distance in between axes (set of disconnected faces and their parameters) in various 3D models; (ii) a keyway (a set of connected faces and intrinsic parameters); (iii) to identify a face, or a set of identical or similar faces in one or several 3D models; etc.

Each element, be it (i) the search of similar 3D models based on volume and boundary descriptors, (ii) the reconciliation (pairing) of terms or characteristics of the descriptors enabling multi repositioning and retrieval of parts of 3D models, (iii) the principle of qualification of the differences and (iv) the display of results combining similarities and differences between several 3D models into a single 3-dimensional space are inventions.

According to another aspect of the invention, we propose a method of comparison of 3D models for the purposes of searching, sorting, comparatively analyzing the boundary representation of 3D models and/or displaying them. According to this method, a descriptor is provided to each of a plurality of 3D models. These descriptors are comprised of (i) geometric characteristics of 3D models that are invariant with regards to the modeling coordinate system and (ii) geometric characteristics of 3D models depending on the coordinate system. When needed, features not depending on the coordinate system to match parts of a first 3D model and parts of at least another 3D model (pairing process) may be used. Features that depend on coordinate system for the parts whose pairing is successful in order to determine a group of transformations that links parts of the first 3D model to parts of at least another 3D model may also be used. At least a group of identical transformations is determined, where the similarities and differences between 3D models are identified, at least in part, by the said group of identical transformations (identical means respecting a certain threshold).

Geometric characteristics of parts of a 3D model which are invariable according to the coordinate system may include the area, the eigenvalues of the inertia moments and/or the perimeter of the planar faces of 3D models. Geometric characteristics of portions of a 3D model that depend on the coordinate system may include the center of gravity and/or the axes of the moments of inertia of the planar faces.

The step to determine at least a group of identical transformations may include determining at least two groups of identical transformations in order to allow the comparison of similar 3D models but where at least a part of 3D models is in a different position and/or orientation.

According to still another aspect of the invention, a method of comparison of 3D models for the purposes of searching, of sorting, of comparatively analyzing the boundary representation of 3D models and/or displaying them is provided. According to this method, a descriptor is provided to each of a plurality of 3D models, descriptors with geometric characteristics of 3D models that are invariant depending on the modeling coordinate system and geometric characteristics of 3D models that depend on the coordinate system. If needed, features not depending on the coordinate system are used to match faces from a first 3D model to at least one other 3D model. Data obtained in the process of pairing between the characteristics of the descriptors of at least two 3D models are stored. For parts of 3D models for which the pairing is successful, a group of transformation is determined to reposition the parts of 3D models in a same coordinate system. At least two 3D models whose 3D models parts are marked according to the types of differences are displayed. A portion of a 3D model may, among other things, mean a face.

According to yet another aspect of the invention, a method of comparison of 3D models for the purposes of searching, of sorting, of comparatively analyzing the boundary representation of 3D models and/or of displaying them is provided. According to this method, a descriptor is provided to each of a plurality of 3D models, descriptors with geometric characteristics of 3D models that are invariant depending on the modeling coordinate system and geometric characteristics of the 3D models that depend on the coordinate system. If needed, features not depending on the coordinate system are used to match the faces of a first 3D model and at least one other 3D model. A collection of data that is related to the pairing of at least some 3D models is stored. The method comprises providing a first result of search, of sorting, and/or of comparison of the boundary representations of 3D models, that uses at least partially the stored data issued from the pairing process. The method further comprises using the features, that are invariant depending on the coordinate system, in order to match the faces between the first 3D model and said at least another 3D model to build on these initial data from the pairing. A second result of search, of sorting, and/or of comparison of the boundary representation is provided using at least partly refined data issued from the matching process.

The geometric characteristics of the 3D model that are invariable depending on the modeling coordinate system may include area, the eigenvalues of the moments of inertia, the perimeter of the planar faces or its type (plane, cylinder, for example), and geometric characteristics of the 3D model that depend on the modeling coordinate system may include the center of gravity and/or the axes of the moments of inertia of the planar faces.

According to a further aspect of the invention, a method of comparison of 3D models for the purposes of searching, of sorting, of comparatively analyzing the boundary representation of 3D models and/or of displaying them is provided. The method comprises providing a descriptor to each of a plurality of 3D models, descriptors including characteristics of 3D models. The method further comprises assigning relative weight to one or more features in a first 3D model. The method comprises generating a numerical pairing value between a first 3D model and at least another 3D model based on the characteristics and, when applicable, the weight attributed to one or more of these characteristics of the first 3D model.

According to another aspect of the invention, a method of comparison of 3D models for the purposes of searching, of sorting, of comparatively analyzing the boundary representation of 3D models and/or of displaying them is provided. The method comprises providing a descriptor to each of a plurality of 3D models. The method further comprises generating a numerical pairing value between a first 3D model and a plurality of other 3D models by using their respective descriptors. The method further comprises generating a display of multiple 3D models arranged spatially in clusters, where each cluster is defined according to common characteristics of the descriptor. Clusters may be based on a search query or based on the importance given to one or a plurality of descriptors characteristics, i.e. a weighting of descriptors.

According to a further aspect of the invention, a method of comparison of 3D models for the purposes of searching, of sorting, of comparatively analyzing the boundary representation of 3D models and/or of displaying them is provided. The method comprises providing a descriptor to each of a plurality of 3D models based on the second order continuity of the faces' underlying surfaces, commonly called 'G2 continuity', by regrouping distinct faces respecting the 'G2 continuity' and cutting faces whose underlying surfaces are not G2 continuous.

According to another aspect of invention a method of comparison of 3D models for the purposes of searching, of sorting, of comparatively analyzing of the boundary representation of 3D models and/or of displaying them is provided. The method comprises selecting distinct parts from at least two 3D models. The method further comprises identifying the respectively identical portions and qualifying the identified portions based on the type of differences. The method further comprises displaying at least one 3D model by marking the portions according to the qualification of the state (identical, type of difference).

According to some embodiments, a search system used to find 3D models in a collection of 3D models uses a query 3D model through a 3D model descriptor is comprised of a selector of features/characteristics used to select at least one feature or a part of a 3D model or a descriptor to which we attribute a different weight for the purposes of the search, and a 3D models comparator, said comparator being configurable to compare a descriptor to a collection of descriptors taking into account said weight of said features or part of model 3D of the search query, and to generate a list of 3D models based on the comparison.

The features selector may assign weight values to the characteristics of a descriptor of the said search query 3D descriptor. The system may also comprise a sorting system of search results, and a view generator configured in such a way to generate displayable scenes with at least a part of the list of the corresponding 3D models, positioned and organized according to preset criteria. Such sorted 3D models may be arranged on the basis of a similarity index computed from the descriptors. These pre-selected criteria may include a criterion that depends on the descriptor. The features selector may be configured to recognize significant descriptors in the resulting sets of 3D and to select one of the significant descriptors. Descriptors may comprise a volumetric component and a face or some other boundary representation.

According to some embodiments, the process of manufacturing a product is characterized by the exploitation of a 3D model for the production of at least a portion of the product, the said 3D model being directly selected and possibly modified by using a system of search/comparison of 3D models or process according to either of the embodiments according to the present invention.

Definitions

In this application, the following terms shall have the following meaning:

3D Model

In this document, the expression "3D model" is used to describe a digital representation in a space of dimension 3 of an object. A 3D model describes the boundaries between one or a plurality of objects and their environment. The boundaries are commonly based on Boundary Representations (B-Rep) as in the STEP standard or in geometric modelers of CAD systems or CAM systems for example or tessellations as in STL or VRML formats, for example. B-Reps are composed of two parts: topology and geometry. The main topological elements are the faces, edges and vertices to which correspond the following geometric elements surfaces, curves and points. The boundaries of objects are composed of one or more faces and each of these faces lies on a surface. A face is a surface limited by one or more edges. So, for purposes of the present invention, a "face" means a limited portion of a "surface". A "face" expresses topological information while a "surface" defines geometric information in a B-Rep of a 3D model. For example, a plane surface corresponds to an equation of the type $ax+by+cz+d=0$ and this infinite surface divides the entire space of dimension 3 into two distinct parts. A face or a plurality of faces joined or not jointed is a 3D model. A set of faces representing a closed and finite Euclidean sub-space of dimension 3 is generally known as a solid body and is a 3D model. A set of faces representing a plurality of solids is a 3D model. B-Reps do not guarantee the uniqueness property of the representation of a 3D model, that is, several B-Reps can correspond to the same object. To obtain this essential property for the comparison of 3D models, the G2 continuous faces (Second geometric derivative) along at least one of their common edges are grouped together and the faces constructed on non-G2 continuous surfaces, if necessary (this case occurs rarely) would be divided. This process detects G2 continuities to create the appropriate descriptors but does not modify the B-Rep such as do Lai [Lai et al, "G2 continuity for multiple surface fitting", Int. J. Adv. Manuf. Technol., 2001] and the healing tools. All the above definitions are known and accepted by those skilled in the art and can be found in reference books in the field [M. E. Mortenson, "Geometric Modeling", third edition, Industrial Press 2006, ISBN 9780831132989] [T. M. Kramer, NIST, "Extracting STEP Geometry and Topology from a Solid-Modeler: Parasolid to Step, 1991, NISTIR 4577] [MIT, MITOpenCourseWare, Computational Geometry Lecture 14, 15, https://ocw.mit.edu/courses/mechanical-engineering/2-158j-computational-geometry-spring-2003/lecture-notes/lecnotes14_fixed.pdf]. Therefore, the surfaces in the sense of the B-Rep and as used in this document, must be differentiated from the surface of an object as used for example in EP 2284770 (Papadakis) which means in fact the entire envelope of the object. In the present definition, any part of a 3D model is a 3D model and any composition of 3D models is a 3D model. 3D models may comprise information other than purely geometry or topology, such as the properties of the materials used or recommended manufacturing processes.

Descriptor

A descriptor may be a representation of a 3D model adapted for a specific purpose, the representation being normally more efficient and more concise than the 3D model itself. The description may comprise a set of information that characterizes a 3D model or a part of it. In some cases, the descriptor comprises a list of volumetric characteristics of a 3D model for example and without being exhaustive, the dimensions of the bounding box of the 3D model, its volume, its area, its principal moments of inertia, its center of gravity, its principal axes of inertia, a list of solid bodies in the 3D model and for each of them, which is also a 3D model, the volume, the total area, the principal moments of inertia, the center of gravity and the principal axes of inertia. In some cases, the descriptor includes (without being exhaustive) a list of faces of the 3D model and for each of them, a list of features, comprising the type of the underlying surface and its parameters, the dimensions of the bounding box, the area, the perimeter, the moments of inertia, the barycenter, the principal axes of inertia for example. The differences and the similarities between 3D models are obtained from a process called comparison of descriptors. A 3D model can also be a descriptor. A 3D model may have several different descriptors.

Form Feature

A form feature may be understood as a part or a property (or attribute) of a descriptor (and hence a 3D model) with a particular interest for a particular processing. A form feature or a characteristic of a shape may also be defined as a descriptor, or any combination of a plurality of elements of a descriptor. As examples, the value of the diameter of a cylindrical face is a basic form feature, the value of a center to center distance of two holes is a form feature, and a round ended keyway is a form feature. Each of these examples corresponds to a part of a descriptor where the form feature may be determined from the descriptors. In its most basic form, the form feature is more simply called feature or characteristic. A characteristic is said to be intrinsic to a 3D model or its descriptor if it depends only on the said 3D model or its descriptor and can be determined from it alone and not from the context, i.e. a 3D model that would encompass the feature. Otherwise, the feature is called extrinsic.

Pairing

Pairing represents the process for determining of the matches between the characteristics of two descriptors. Part of a descriptor may, for example, characterize a solid body or a face. The pairing process matches the part of the descriptor to another part of a descriptor (the same one or another descriptor) when the two parts of the descriptors share similar characteristics (same or included in intervals of values for example). Such process allows, among others, to pair through the respective descriptors, solid bodies or faces of 3D models without taking into account their position in space. The pairing process does not require 3D models to be described with the same geometric representation (STEP and Parasolid, for example) or to be expressed in a common coordinate system.

Reconciliation

Reconciliation represents a process of clustering of elements or portions of descriptors by taking into account the relative position in space of the form features associated with the paired portions of descriptors. The process proceeds by determining the groups of transformation matrices which allows the positioning of the form features in a common coordinate system. Said process allows among other things the recognition of the characteristics of identical or similar forms between 3D models. Thus, as an example at the level of the faces, the pairing identifies faces which share intrinsic characteristics. As an example, if the type of some faces is cylindrical, the diameter might be between 5 and 6 mm and the length is 20 mm. During the reconciliation, extrinsic parameters are taken into account. As an example, the direction of the axis of the cylindrical faces may be equal to the Z axis and the center to center distance may be equal to 20 mm. The pairing-reconciliation process may be applied iteratively.

Comparative Analysis of the Descriptors

The comparative analysis of the descriptors is a process determining and describing the identical and distinct characteristics between descriptors according to the query that is specified by the operator. The comparison is performed on the whole or only portions of the descriptor. A different weighting, specified by the operator, may be attributed to each part to emphasize on certain form features, or even to consider only a portion of the 3D model. The similarity index is determined from the comparative analysis of the descriptors.

Operator

The operator refers to both a human operator as another computer system, interacting with the system, interactively or offline (batch mode).

BRIEF DESCRIPTION OF THE DRAWINGS

The embodiments of the invention will be better understood through drawings, which are listed below and which come with the number of examples appearing in the detailed description of the embodiments of the invention, among which.

DETAILED DESCRIPTION OF THE PREFERRED EMBODIMENT

Figure 1:
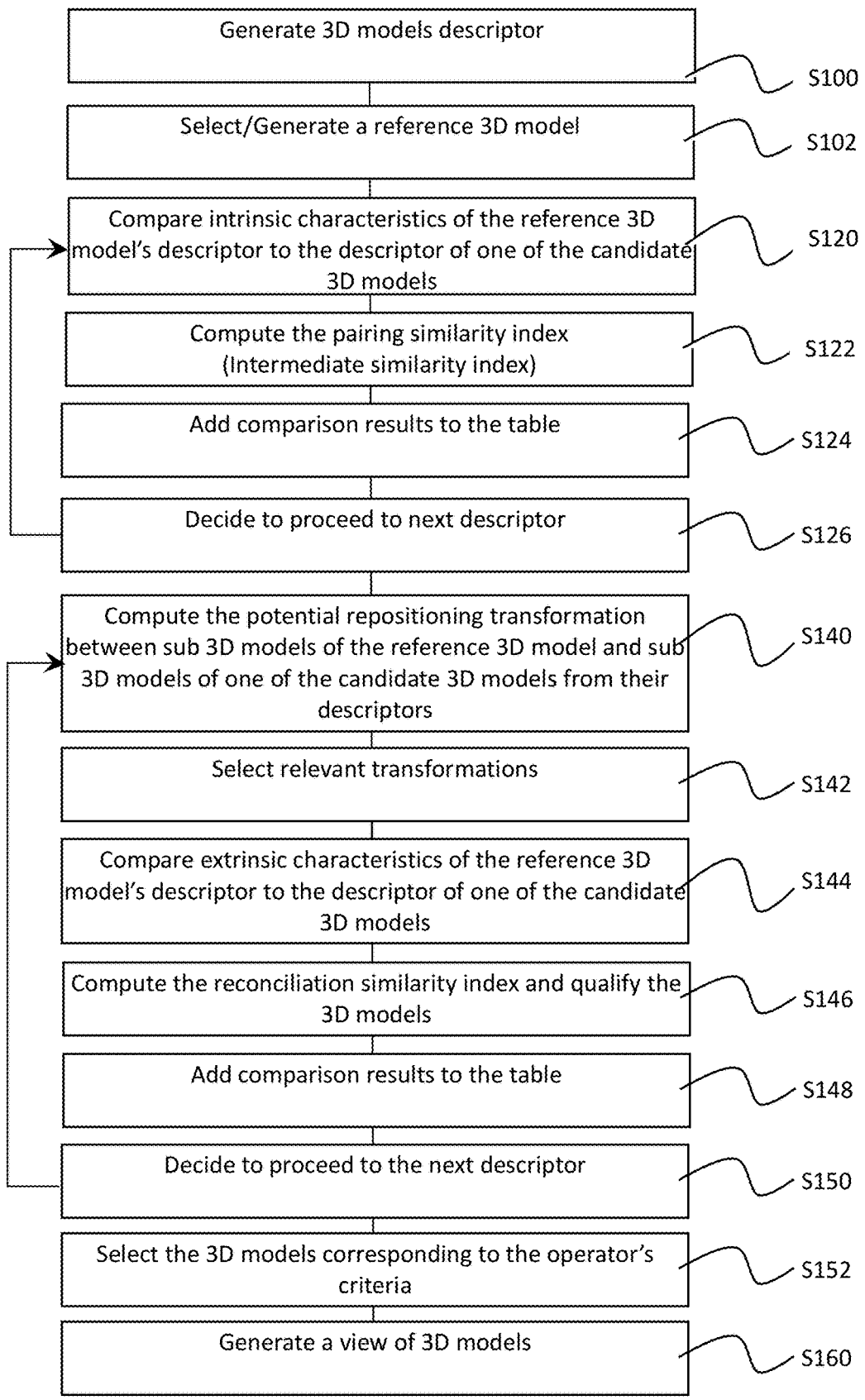
FIG. 1 shows a diagram of a sequence of steps of a process according to an embodiment of the invention.
Figure 2:
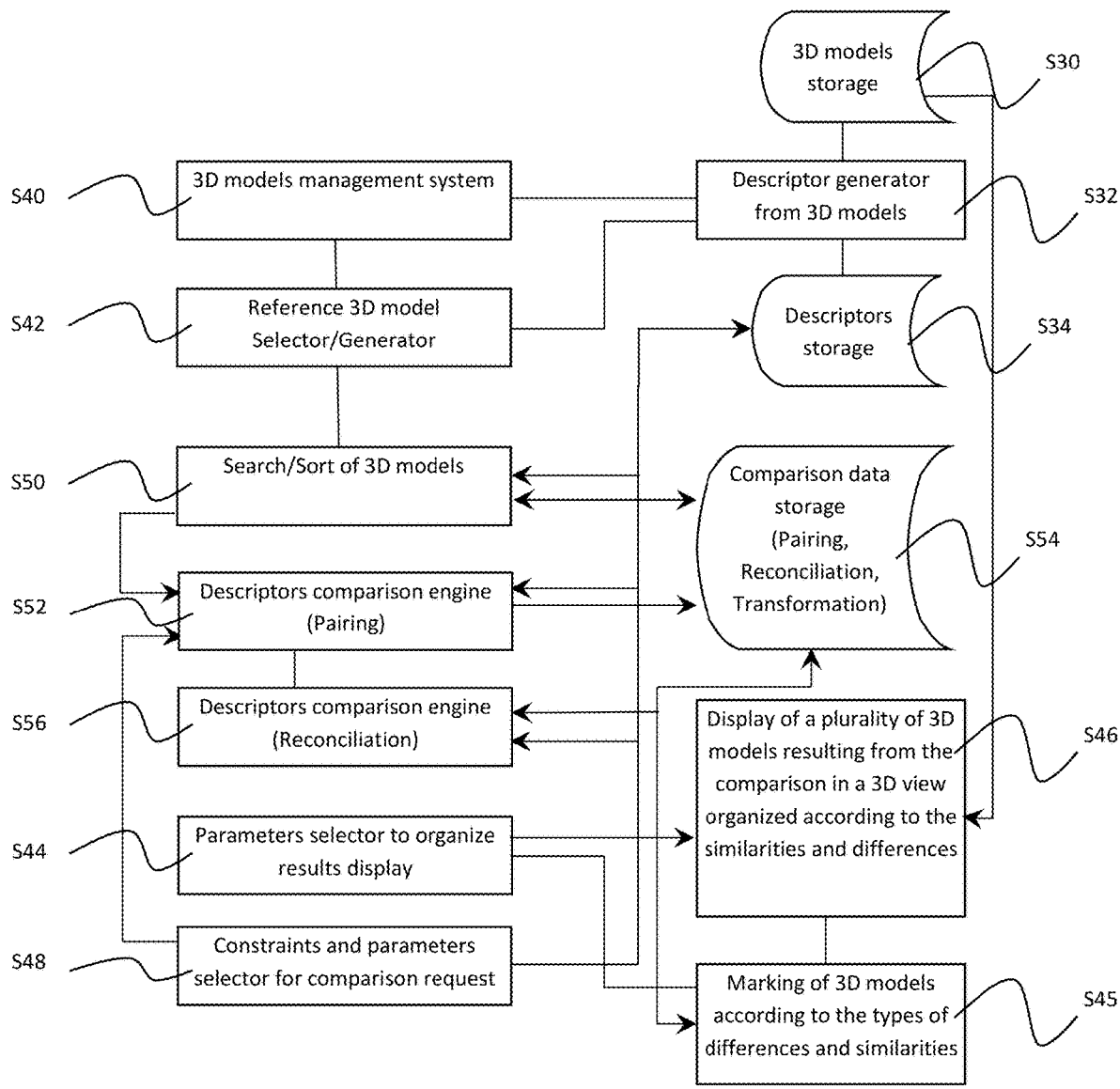
FIG. 2 shows a block diagram of a computer system according to an embodiment set to at least run the process shown in FIG. 1.

The embodiments of the invention are described according to FIGS. 1 and 2 which show the sequence of steps to determine concomitant similarities and differences between a reference 3D model and a number of 3D models from their descriptors. The number of 3D models under consideration may vary tremendously. Insofar as the objective is to compare a reference 3D model to some known 3D models, such number may be low. In contrast, if the goal is to find an appropriate or similar 3D model, the search may be performed on thousands or even millions of descriptors of existing 3D models. FIG. 2 shows a block diagram of a software system which can perform the steps shown in FIGS. 1 and 2 in essence.

Figure 3:
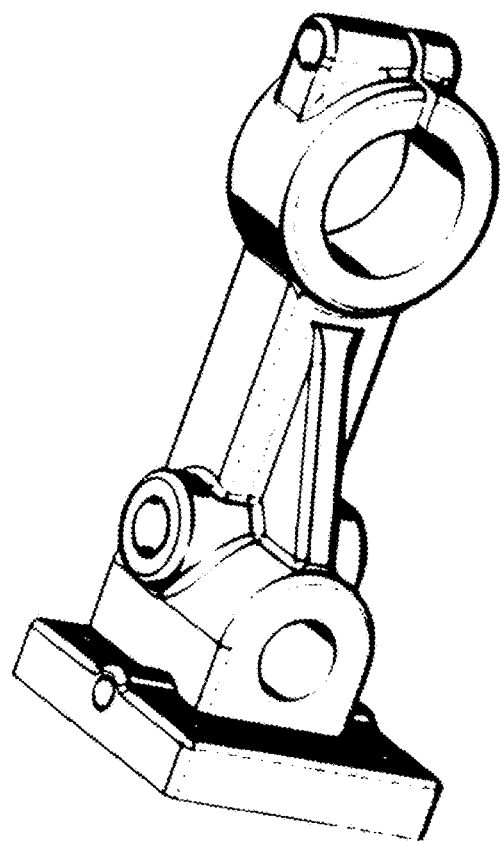
FIG. 3 is a view of a 3D model.
Figure 4:
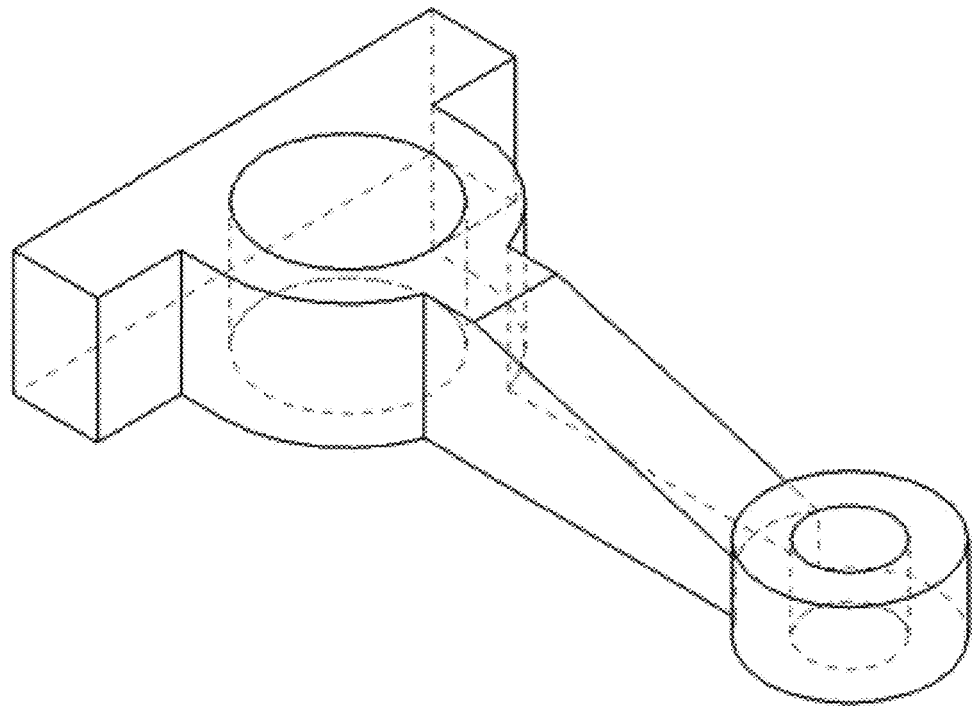
FIG. 4 is a view of a simplified version of the 3D model of FIG. 3.

FIG. 3 shows an example of a 3D model of a part. To simplify the description of the following embodiments, FIG. 4 shows a simplified version of the 3D model of FIG. 3. The said simplified version will be used in the following description. The illustrated exhibit contains two circular openings of different size in its upper and lower parts and a middle part which connects the upper and lower portions.

Figure 5:
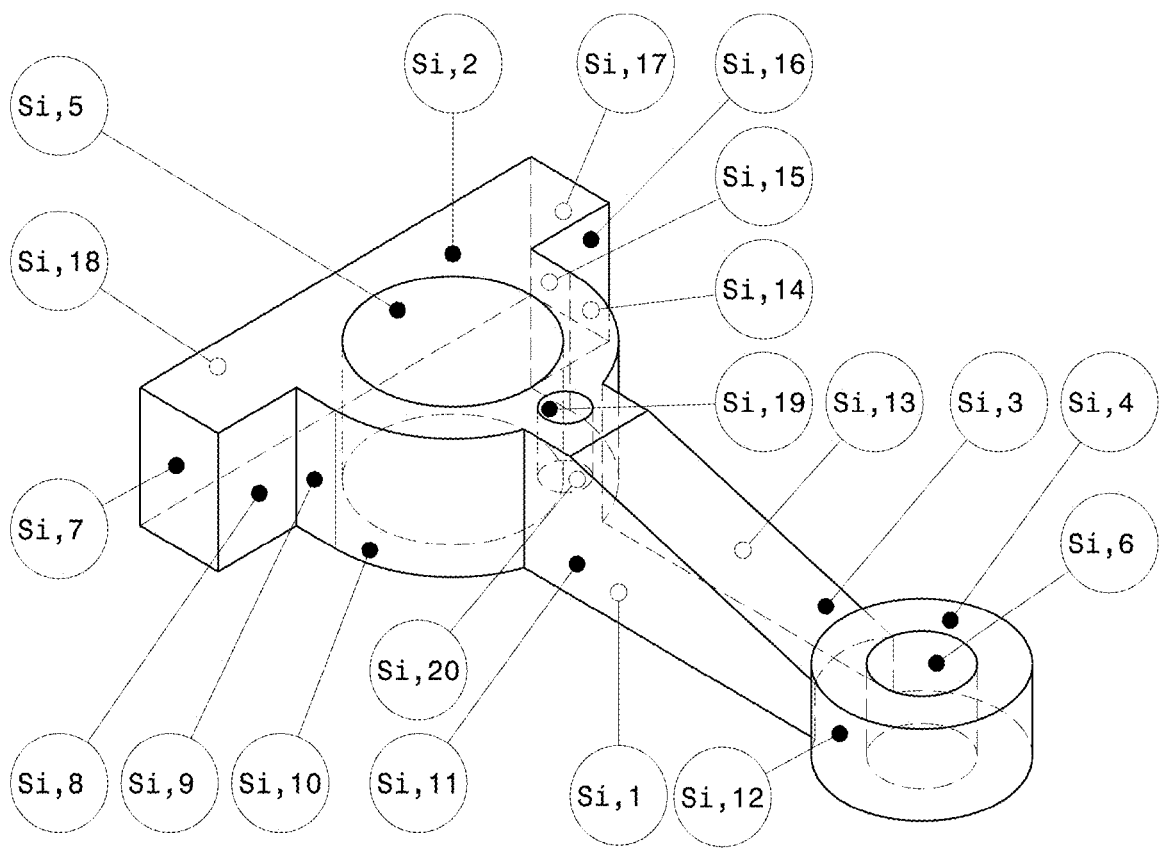
FIG. 5 is a view of the 3D model in FIG. 4 that identifies in a generic way the faces of 3D models.

In FIG. 5, the faces are marked from $S_{i,1}$ to $S_{i,20}$. Labelling is quite arbitrary, and can differ from a 3D model to the other. Thus the label $S_{m,f}$ of a face identifies the face f of the 3D model m. The descriptor in this embodiment may consist of a list of characteristics, such as the type of the 3D model (Type), parameters depending of the type (TypePar), the volume, in the case of a solid body or area, in the case of a face (Int (N)), the area of a solid body or the perimeter of a face (Int(N−1)), the center of gravity (Gx, y, z), moments of inertia (M1, 2, 3), the axes of inertia (Ai x, y, z with i=1, 2, 3) and the dimensions of the bounding box (Bx, y, z) for each solid body forming the 3D model and for the complete 3D model, as well as for each of the faces composing the 3D model.

The boundary representation does not respect the uniqueness property, i.e. more than one boundary representation may exist for a given 3D model. But said uniqueness property is essential to the comparison of 3D models. It is possible for example using different modeling systems (say two CAD systems) that the set of faces, composing the boundary of a 3D model, is not always unique. To solve this issue, "strictly G2 continuous" faces are used. Thus, faces may be grouped to form a single face if the second geometric derivative, usually denoted G2, is continuous along a common edge of the two faces. Similarly, a face whose underlying surface would not be G2 continuous would be split into multiple faces so that the underlying surface of each resulting face is G2 continuous. By proceeding in this way, the uniqueness property is restored at the level of the faces of the boundary representation.

Figure 6A:
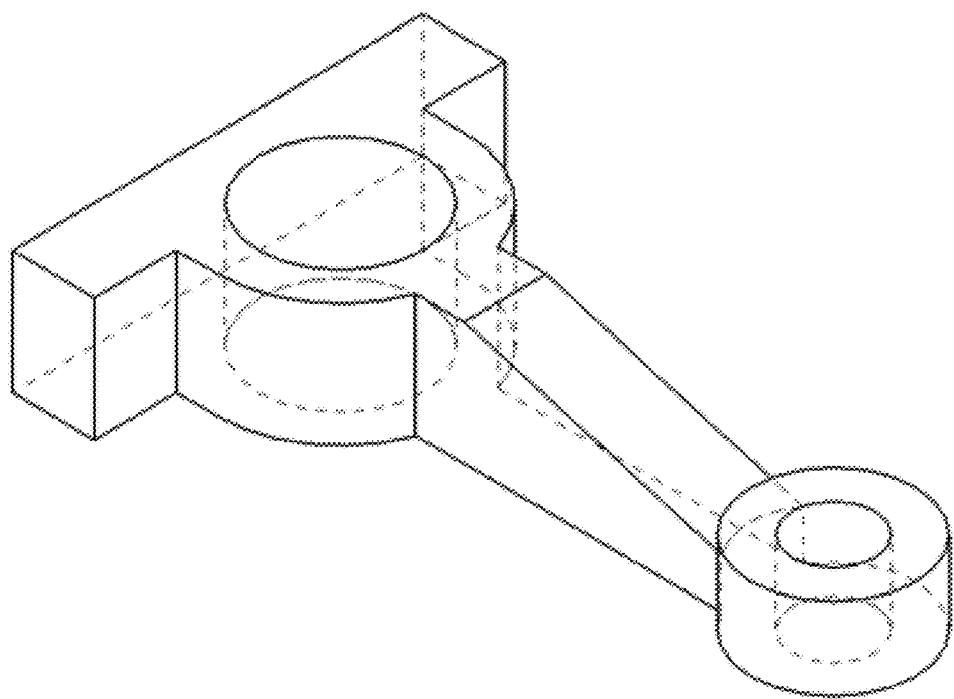
FIG. 6A is a view of the 3D model used as reference 3D model in the description of this realization.

Table 1 presents the values of characteristics for the 3D model of FIG. 6a. The link between the identifier of a 3D model in the descriptor (Mod3D column) and the 3D model itself could, for example, be resolved with a lookup table.

Figure 6B:
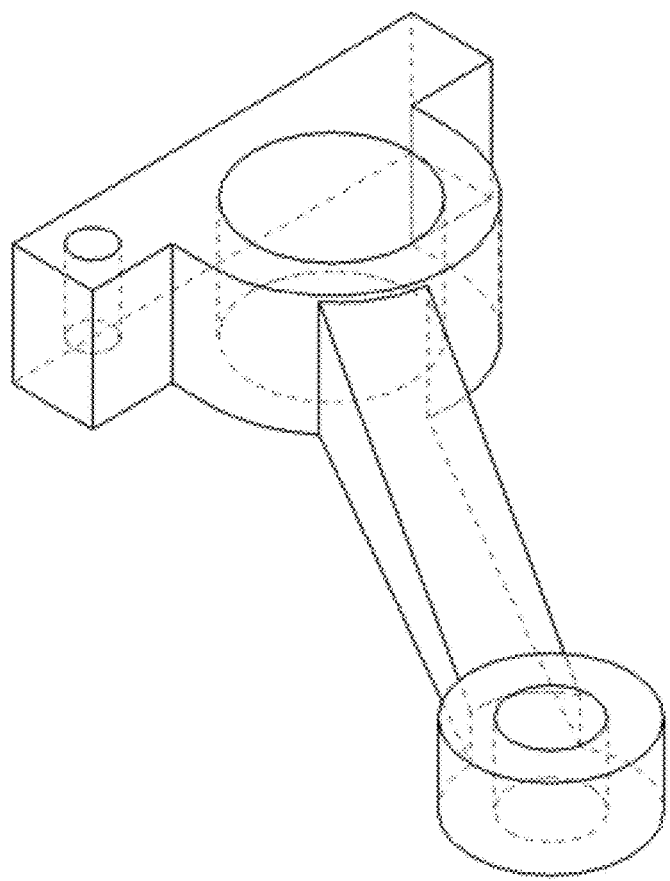
FIG. 6B is a view of a 3D model similar to that shown in FIG. 6A to describe the process of comparison.

FIG. 6b presents another example of 3D models. Table 2 shows the values of the characteristics of its descriptors.

In FIG. 1, the step for building descriptors is S100. All 3D models are subject to this step. The said step may be performed at different times. Adequate descriptors may be stored with the data from the 3D models or separately.

In FIG. 2, 3D models are stored in a data store referenced S30. The data store reference S30 may be embodied as a single data store or as a distributed storage of 3D models. Descriptors generator S32 reads the 3D models in data store S30 and saves the descriptors in a second data store called S34. Said data store S34 may be integrated in the S30 data store, or may be separated and may also be remote.

The system may comprise a 3D models management system S40 controlling the 3D models to be compared. A selector or a generator of a reference 3D model S42 allows an operator to select or create a reference 3D model. The descriptor of the reference 3D model may be generated using the descriptors generator S32 and inputted to the search engine or comparison engine S50. The S50 engine retrieves or fetches the descriptors from S34 data store.

The system described in FIG. 2 may reside on an independent workstation or may be distributed among different computers and/or servers in order to ease the processing, storage and management of data.

Figure 7A:
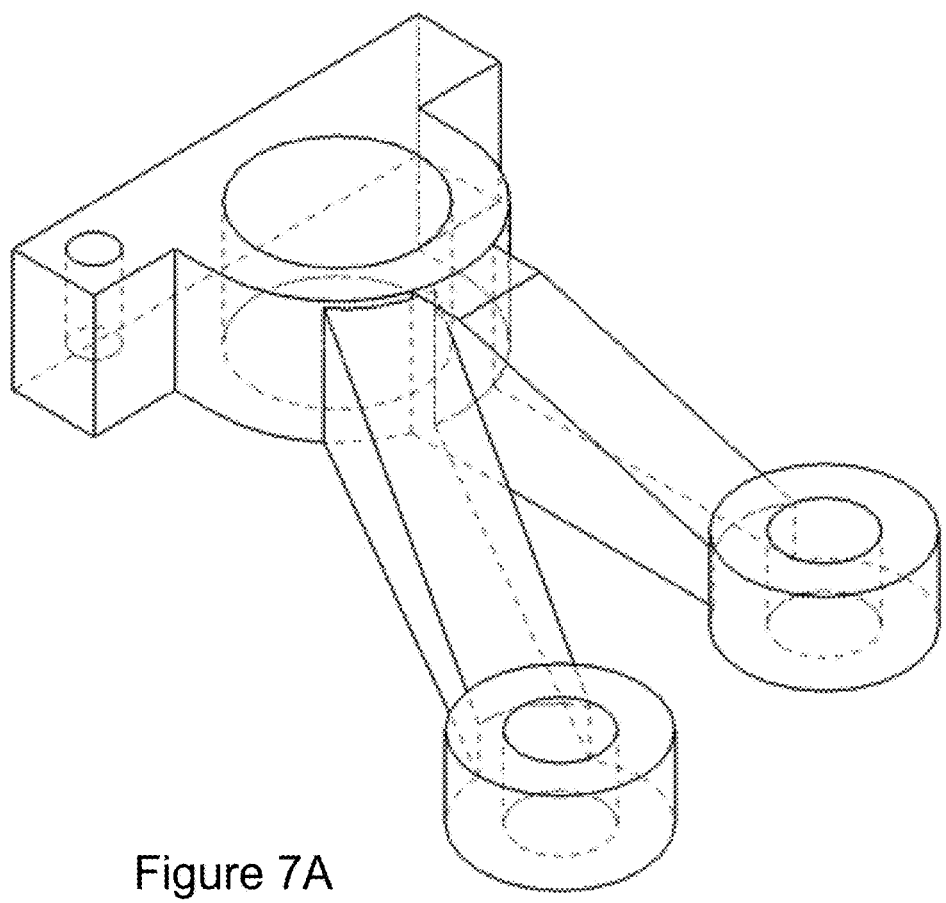
FIG. 7A is a view of the 3D models of the FIGS. 6A and 6B following an initial position.

FIG. 7A shows the 3D model of the FIG. 4 on which is superimposed a second 3D model, namely that of FIG. 6B. The latter presents differences from the reference 3D model in FIG. 6A, namely the middle part is longer (the center to center distance increased from 120 mm to 150 mm), and the middle part connects to the bottom at a different angle of 30 degrees. The 3D model in FIG. 6A is the reference 3D model selected in step S102 of FIG. 1 and the 3D model in FIG. 6B is the one to which the reference is compared to explain the method. Such comparison is performed for each available 3D model.

Figure 7B:
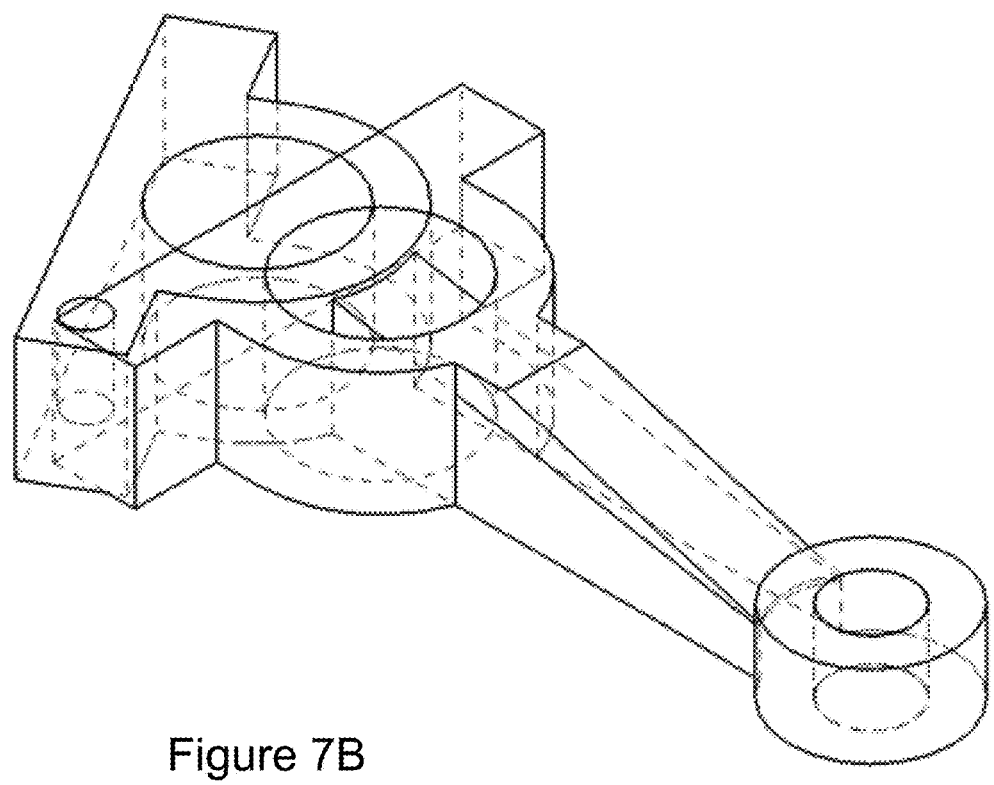
FIG. 7B is a view of the 3D models of the FIGS. 6A and 6B following a second position.

FIG. 7B shows two 3D models in a different relative position. The systems described in the prior art use only a single relative position to compare 3D models. The relative position is either automatically determined from the coordinates system specific to each 3D model, either using a "best-fit" of the two 3D models or by an operator. The approach adopted in the following embodiments determines from the characteristics of the faces in the descriptors all relative positions that allow reconciliation of the form features (parts of the initial 3D models) from the compared 3D models.

Although a comparison at the level of solid bodies between two 3D models may produce useful results for research purposes, such method may not be useful to identify a 3D model inside another 3D model (higher complexity), which would contain one or more parts of the searched 3D model. A comparison of the faces allows matching of the said faces to identify 3D models which may potentially contain the desired 3D model. The matching of faces is obtained through an iterative process of comparison of descriptors in two steps. The first step provides pairing based on intrinsic 3D model specifications. As an example, the area or the moments of inertia of the intrinsic 3D model. The second step provides reconciliation based on extrinsic characteristics of the 3D model, for example the center of gravity or the axes of inertia of the 3D model, the said characteristics depending on the 3D model but also on the coordinates system in which it is described, and more generally from the context of the 3D model.

The identification (in the labelling sense) of faces typically differs among compared 3D models. However, in the context of our simplified example, the numbering is identical only in order to facilitate the understanding of the process. Using intrinsic characteristics of faces of the descriptor, faces among 3D models are matched. For example, the values of the characteristics area Int (N), perimeter Int(N−1), and three moments of inertia M1, 2, 3 of faces Si,5; Si,18; Si,6 and Si,4 are unique and identical and therefore these faces are matched between the two 3D models with a maximum confidence index of 1. By contrast, the intrinsic values for faces Si,7; Si,8; Si,16 and Si,17 are not unique and involve multiple potential pairing of faces, for example S1,7 with {S2,7; S2,8; S2,16; S2,17} or even S1,9 with {S2,9; S2,25}. Such undetermined pairing of faces will be thrown during the step of reconciliation. For the faces S1,1; S1,2 and S1,3 with S2,1; S2,2 and S2,3 respectively, the values of the intrinsic characteristics are unique but some values differ between the faces of the two compared 3D models. The said faces of the two compared 3D models are paired with a confidence index being less than 1. The index may be calculated using different methods. For sake of simplicity, a simple method to calculate the index is presented. Such method uses the summation of the index for each characteristic taken into account divided by the number of considered characteristics. When used with a quantitative parameter, for example, the index is calculated following one minus the absolute value of the ratio of the difference of the values for this characteristic and their average value let's say |(Vref−Vcomp/((Vref+Vcomp)/2)|, and when used with a qualitative parameter, a table of values corresponding to the cases of difference. Understandably, the method is used only as an example and is defined otherwise in other embodiments of the process. The said index is involved in the determination of the index of similarity between 3D models in our embodiments. The number of faces of the two compared 3D models may be different, and at the end of the present step some faces may remain unpaired.

The result of the comparison of the descriptors of the present simplified example and with the described embodiment after the pairing stage is presented in table 3.

The table 3 shows a comparison between intrinsic characteristics of solid bodies showing an imperfect pairing (similar but not identical 3D models) followed by a comparison between intrinsic characteristics of faces. Several cases are shown, like the perfect unique pairings, or multiple pairing with identical characteristics values and pairing based on values of only partially identical characteristics and therefore with an index of confidence that is less than 1. Ambiguities are thrown in a subsequent phase of reconciliation.

The pairing process has been described at the face level of a 3D model. We understand that a similar process is applicable at the body level to a plurality of solid bodies, if they exist in 3D models. Pairing is done using their intrinsic characteristics, such as volume (Int (N)), area (Int(N−1)), three Moments of inertia (M1, 2, 3) with the present example of descriptor following the same principle. The process therefore may also, as an example, be used to compare assemblies of 3D models, or even to find subsystems in more complex systems. Starting from the step S120 (see FIG. 1), the index of confidence corresponds to a temporary similarity index that is used to increase the efficiency of computation in the process. When a 3D model having an index of confidence computed in relation to the reference 3D model, falls below a threshold determined by the operator, the comparison between descriptors and the temporary index of similarity (step S122 in FIG. 1) is not refined. Such step provides a rapid indication of potentially similar 3D models and allows dealing with a great number of 3D models without the need to refine the comparison when not required.

The pairing compares 3D models or of portions thereof, which are herein known as 3D models (be it a face, a set of faces (form feature), one or several solid bodies) by analyzing intrinsic parameters of the descriptor. At this stage, each 3D model is considered in isolation without taking into account the relative position of the 3D model in comparison with other 3D models.

The scale of a 3D model may generally be considered as being well defined and a low index of confidence on dimensional characteristics may be considered as a ground to reject a pairing. However, in some cases, a scaling factor may be determined during the process of pairing of the faces, and that pairing may thus be realized for a given scale factor.

The addition of the data in the rows of the table for each 3D model which is compared to the 3D model of reference is performed in step S124 of FIG. 1. When a threshold number of similar 3D models is obtained or when all available descriptors were compared, the refinement of the comparison process may continue (in step S126). From the step S126, the method may further comprise a step to identify the 3D models being the mostly similar based on for example the number of paired faces or the ratio of the sum of the areas of paired faces and the sum of the areas of all faces, or any other function that would determine a temporary similarity index. Referring now to FIG. 1, the method further comprises the step of reconciliation of the 3D models. Based on the above definition, the 3D models may be one or a plurality of faces or one or a plurality of solid bodies. The method may further comprise focusing on the most promising 3D models.

In FIG. 2, the comparison engine S52 performs the comparison of descriptors and the storage in the data store S54 of the comparative data presented in the tables. The engine S50 controls the process and performs the computation of a similarity index.

The step of reconciliation S140 shown in FIG. 1 comprises taking into account the extrinsic characteristics of descriptors and more particularly the relative positions of the 3D models between them. Using the definitive pairings (having a confidence index=1), transformation matrices of the coordinate systems are determined. The transformation matrices reposition the compared 3D models in a common coordinates system, such as the coordinate system of the reference 3D model. The determination of the transformation matrices is well-known in the art and is a fairly routine operation. At this stage, several transformation matrices are created. When applied to the 3D models, some of the matrices are used to reconcile only the 3D models that helped in the computation of the matrices. The relevance of such matrices is therefore low and the matrices are discarded at the step S142.

Understandably, the transformations or the transformations matrices to the coordinate systems may not be calculated between all the geometric characteristics of the descriptors (parts of 3D models, for example faces) to define at least a group of identical transformations (taking into account computational tolerances), just like a transformation for a first characteristic (e.g. a first face) may be computed to then try to apply the said transformation to the other characteristics (e.g. other faces). Accordingly, a group of characteristics having a common transformation may be developed.

For each repositioning obtained by applying transformation matrices which are retained, the extrinsic characteristics are compared (step 144). In the present example, two matrices are retained. A first matrix M1 positions 3D models as shown in FIG. 7A. The faces Si,5, Si,6 and Si,18 which were already positively paired are reconciled and perfectly matched together. The faces are determined as being identical for the specific positioning. Using generated matrix, the pairing ambiguities of the faces Si,7; Si,8; Si,9; Si,15; Si,16 and Si,17 are discarded. The remaining faces are reconciled and are also determined as being identical for the positioning. Finally, the extrinsic characteristics of descriptors of the faces S1,2 and S1,10, with S2,10 and S2,14 are compared. Upon comparison, multiple values are determined as identical and others as different. The faces are reconciled with a confidence index of less than 1. The faces are identified as being different and the identified differences are qualified using the comparison of the descriptors as will be demonstrated at the marking stage. The second matrix M2 is applied to position the 3D models as represented in FIG. 7B. The faces Si,4 and Si,6 as positively paired, are reconciled to perfectly match together. Therefore, the paired faces are declared identical for this second positioning. Finally, the faces Si,11; Si,12 and Si,13 are reconciled using an index of less than 1 and thus comprising differences for the particular positioning. Based on the predetermined threshold value of the confidence index, a face such as Si,3 is also reconciled. A plurality of transformation matrices may lead to reconcile some faces multiple times. In such an event, the reconciliation having the best confidence index value is used. These matrices do not help resolve all ambiguities in all cases and sometimes some faces remain orphaned. Such faces are new faces, or heavily modified faces.

Table 4 presents the data added by the stage of reconciliation for the present example. All data of the table 4 or only data having a certain interest to the continuation of the process and to the needs of the operator may be stored.

It is found that the principle of multi positioning introduced in this invention completely redefines the concept of comparison and differences between 3D models and allows comparison of parts of 3D models (form features). Thus, the comparison can be executed using all transformation matrices, or by using only one or more particular matrices, or even by constraining the determination of a matrix on some characteristics of the descriptors selected by the operator. Understandably, in step S146, similarity indices that depend on these choices may be computed.

The method may further comprise the truncating of the table of comparison data to remove multiple and ambiguous pairing of faces which were introduced during the pairing step for which the values of the intrinsic characteristics are considered non-relevant during reconciliation (step S148). Table 5 shows the comparison data after being cleaned out in the context of the present example.

The refinement of the comparison process continues until a sufficient number of similar 3D models either is reached or that all the available descriptors have been compared in step S150.

Understandably, such a process of comparison between 3D models is useful for many applications such as retrieving similar 3D models, classifying 3D models according to an index of similarity, making a classification (clustering) of the 3D models, highlighting the same or different characteristics, or still allowing identification and reconciliation of references (identifiers) when a 3D model is substituted for a reference 3D model.

The reconciliation engine S56 (see FIG. 2) carries out the above-mentioned operations and updates data in the data store S54.

Figure 9:
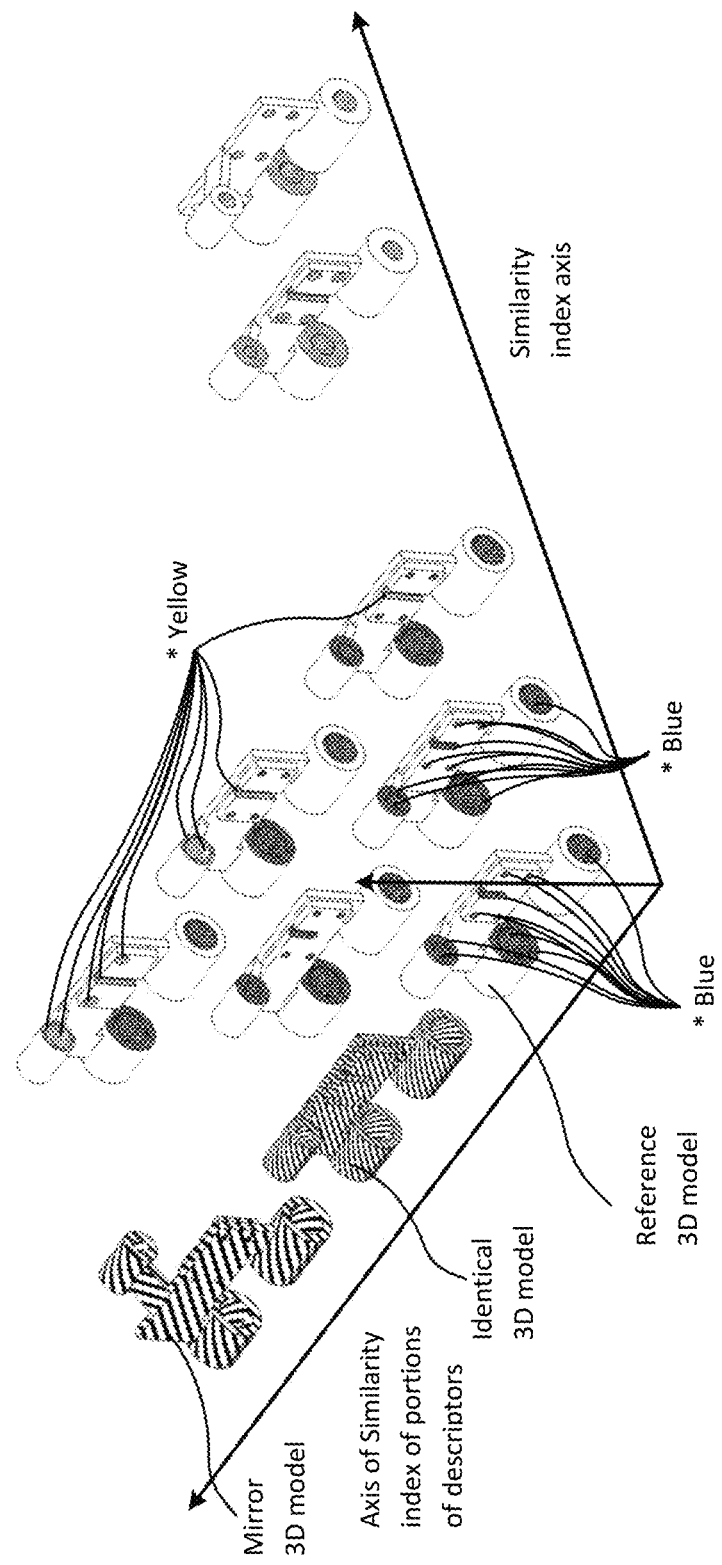
FIG. 9 is a perspective view of a display of a plurality of similar 3D models positioned and marked according to the result of their comparison with the reference 3D model and the constraints defined by the operator.

Referring to FIG. 2, the method comprises identifying the 3D model having the closest similarity to the reference 3D model using the engine S50 which relies on data from the tables in the data store S54 powered by engines S52 and S56. The identified 3D models are now ready to be displayed to the operator through the system S46. The system S46 generates a requested view of the 3D models. To generate the view, the system S46 fetches the 3D models stored in the data store S30 and the marking engine S45 uses the data from the comparison data store S54 to mark identical or different faces or to mark other characteristics of the 3D models. The operator selects the desired settings or marking criteria through the interface S44. The interface S44 also allows the selection of the properties and functions which determine the layout of 3D models in a 3-dimensional space generated by the system S46. In certain embodiments, S46 uses a CAD system or a Web browser (web viewer) to display the results in 3D. The layout and marking of the displayed 3D models vary depending on the needs of the operator. For example, in some cases, the operator may want to highlight the identical parts (form features) of 3D models for a particular positioning, or for multiple positioning or even highlight differences for one or more characteristics. It is believed that such method of simultaneously communicating the comparison of several 3D models based on the marking and the position of the 3D models in a 3D scene, such as illustrated in FIG. 9, is entirely new.

Understandably, several types of differences between face, sets of faces (form features) and solid bodies are determined when 3D models are compared. The marking distinguishes the said 3D models according to the requests of the operator. The following presents some examples illustrating the types of differences according to the needs of the operator. In a first example, the operator searches, in a set of 3D models, for form features identical to those present in the reference 3D model without inputting said form features. In this case, the process executes pairing, reconciliation, multi repositioning and marking of faces as a result. The faces Si,4; Si,5; Si,6; Si,7; Si,8; Si,9; Si,15; Si,16; Si,17; Si,18 respectively on the reference 3D models (i=1) and on the compared one (i=2), are fully identical at a given position (a transformation matrix) and are therefore described as identical and marked accordingly (using for example the blue color). The faces Si,1; Si,2; Si,11; Si,13 and faces S1,10; S1,14 with face S2,10 of the 3D models are first paired with a low index of confidence. The index of confidence is reviewed to be increased during reconciliation. The said faces are eventually marked as having identical geometry but different topologies (using for example the green color) because they share the same geometric characteristics (axis and radius for the cylindrical faces S1,10; S1,14 and S2,10 and the same normal and position for the planar faces Si,1; Si,2; Si,11; Si,13) but differ on other characteristics (values) of their descriptors which characterize their topology (perimeter for example in our descriptors). The pairing and reconciliation of the face Si,13 of the compared 3D models do not return a level of confidence being high enough to conclude with confidence that the face is the same as the modified face. At this stage, a few unreconciled faces remain so the best choice is remaining. In this case, the characteristic Type is identical and depends on the threshold value of the confidence index. The characteristic is identified as "reconciled and different" (using for example the purple colour) or simply identified as "not reconciled and new" (using for example the red color). The faces are different both from the point of view of their geometry and their topology for all selected transformation matrices. Faces S2,19, and S2,20 are identified as "non-reconciled", so new (using for example the red color).

In another example, the operator selects, through the interface S44 (FIG. 2), a portion of the 3D model (which becomes de facto the reference 3D model). The portion of the 3D model represents the functional faces or faces in contact with other components (interfaces), as an example to illustrate the present, faces S1,5; S1,1; S1,18 which are also used to define a positioning (transformation matrix) for the step of reconciliation, as well as the faces S1,6; S1,4. To ease the interpretation of the results, the operator inputs that the identical faces on the found 3D models be marked in blue, that the reconciled faces with identical geometry but whose topology is different be marked in cyan and finally that the other faces (not taken into account, not reconciled, new) to be grayed out and transparent. Now referring to the 3D models of FIGS. 6A and 7B, the faces S2,5; S2,18 are identified as identical (hence in blue), the faces S2,1; S2,4; S2,6 are geometrically identical (hence in cyan) and all the other faces are not considered (hence in grey, transparent).

Understandably, the operator may set extremely precise constraints using an appropriate graphical interface S44 such as e.g. impose the center to center distance and the diameters of the faces Si,5 and Si,6 or the parallelism and the distance between Si,11 and Si,13. All these constraints may be computed from the characteristics of the descriptors contained in this embodiment.

Displaying a 3D model with a label or with different textures or colors associated to specific faces is well-known in the art.

Differences are represented using colors, transparencies, textures, hatches, annotations or any other graphic effect that may be considered as being a marking. The similarity between the 3D models is represented with the position of the 3D models in the 3D space of the 3D scene displayed in the viewer. The similarity is typically defined as the 3D models having the lowest number of differences according to the operator requirements.

It shall be understood that a wide range of markings may be used. Thus, similarity is expressed by the respective positions in the 3D space of 3D models obtained by the function computing the index of similarity. The similarity may also be appreciated from the marking of differences in 3D models. For example, if a hole from the reference 3D model is smaller in diameter than the hole of the other compared 3D model but comprises an identical axis, the 3D model will be marked in some way; on the other hand, if the diameter and the axis are different, the said hole is marked using a different marking to differentiate the two types of differences.

In certain embodiments, the process of comparison of the descriptors is influenced by the definition of characteristics of interest or by those on the contrary that are not of interest. The definition of characteristics may be explicitly or implicitly specified by the operator. In step S152 of FIG. 1, 3D models are selected according to similarity indices and the criteria expressed by the operator. The results are formatted and displayed in step S160. Among other possible forms, 3D models displayed in a 3D space as shown in FIG. 9, with identification by marking, as described above, of the similarities and differences and the use of the positioning within the 3D space of 3D models is new and represents the way of communicating the results. We understand that these results may also be transmitted in text format (table, list or other form).

Figure 8:
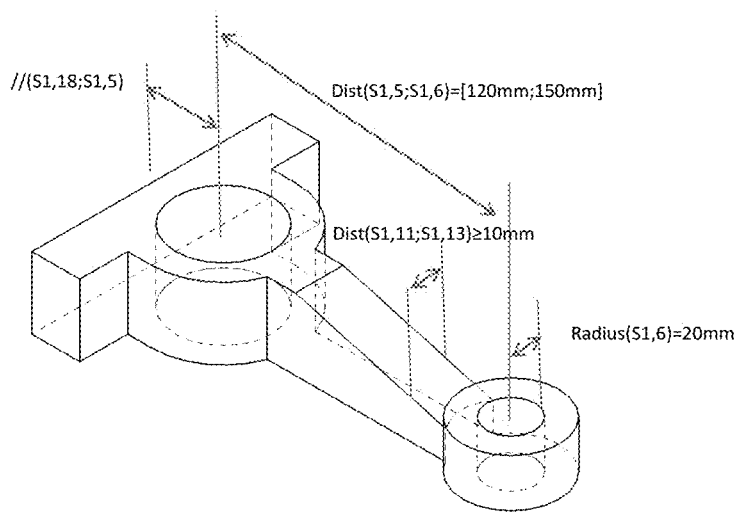
FIG. 8 shows a perspective view of the reference 3D model and an interface to the definition of constraints by the operator showing a set of constraints used to describe a particular embodiment.

FIG. 8 shows the simplified 3D model of FIG. 4 and represents an example of interface for the definition of the comparison constraints. In this case the full 3D model is taken into account to make the comparison by authorizing the multi repositioning for similarity assessment, and the constraints have been imposed such as (i) the distance between the axes of the cylinders Si,5 and Si,6 must be between 120 and 150 mm, (ii) the faces Si,18 and Si,5 must be parallel, (iii) Si,6 must have a radius of 20 mm and finally (iv) the distance between the faces Si,11 and Si,13 must be greater than 10 mm. The constraints may be determined using the constraints determination interface S48 shown in FIG. 2. The operator has the ability to define if all or only a portion of the 3D model is taken into consideration. In this case, the operator selects portions of the 3D model to be used (which are also 3D models) and for each part, the operator indicates if the portions of the 3D model should be identical or only similar with the 3D models to be compared. The operator further selects the possibility of using multi repositioning or of imposing a coordinates system to make the comparison. As an example, the coordinates system may be the current coordinates system of the 3D models or a specific coordinates system built from constraints to be imposed. Finally, the operator may set constraints that are of greater importance to him. As examples, the user may set constraints such as a center to center distance between 120 and 150 mm for the two cylinders Si,5 and Si,6, a radius of 20 mm for cylinder Si,6 and a distance greater than or equal to 10 mm for the faces Si,11 and Si,13. The operator therefore builds constraints directly on the explicit characteristics of the descriptors (radius of Si,6=20 mm) but also on implicit characteristics (distances between axes Si,5 and Si,6 or parallelism between Si,18 and Si,5). Such implicit characteristics are added in the tables containing the results of comparison (additional columns) to participate in the calculation of the index of similarity.

This way of defining constraints is similar to method provided by the CAD systems to constrain sketches or assemblies and is known in the State of the art.

Understandably, the inventory of properties or available constraints, their mode of selection, their layout and ordering, as well as how the properties are weighted may varied in a multitude of variations without departing from the underlying functionality. Rather than offering a simple binary selection (distinguishing a selection "keep/important" of another "withhold/not-important"), the interface could, for example, accept a value of weighting expressed as a percentage of importance or another calibrated value. Similarly, the operator may eliminate parts or portions of 3D models that are considered insignificant to the application. As an example, solid bodies smaller than a given size (size of the bounding box) or volume or faces whose area would be less than a certain percentage of the total area of the 3D model (3D model simplification) could be eliminated. It is also possible to force the comparison by a volume of maximum occupancy (reservation of space in an Assembly).

During the process of comparison, constraints such as for example, expressing the distance between the two cylinders can be used as a filter (Go/No Go) or intervene only during the marking stage to show that the constraint is satisfied or otherwise unmet. These constraints may also be taken into account when computing the index of similarity which can then be seen as an indication of compliance with the constraints.

It shall be understood that when constraints are changed, the entire process may be repeated or only the index of similarity and marking of already selected 3D models may be computed.

In certain embodiments, 3D models are ordered following the comparison process based on pairing and reconciliation of descriptors according to the computed similarity index.

FIG. 9 shows an example of eight 3D models of a component of a hinge similar the reference 3D model (i.e. to the 3D model used in the comparison for the purposes of the presented search). The 3D models are displayed in an isometric 3D view (for example, an Assembly in CAD system). It shall be obvious that the operator may change the perspective.

The 3D model used as the reference 3D model is preferably positioned at the origin (or the bottom right corner). The faces in blue (marked with "* Blue") are taken into account in the marking of differences after the comparison. The faces in grey (not identified faces) will not be marked whether such faces are identical or different to facilitate interpretation of the results for example. Similar 3D models are positioned in a 3D space using criteria related to each of the three axes. Marking (colors, textures, transparencies, annotations, etc.) may represent other criteria or information. In particular, in this figure, one of the axes is used to represent a similarity index. It is possible to modify the display as a function of the level of differences/similarities with the reference 3D model. The more a 3D model differs from the reference 3D model, the more the distance may increase along this axis.

The 3D models having an index of similarity of the same order of magnitude may be grouped along the second axis. Thus, in the example illustrated, two 3D models are displayed in the first row directly next to the reference 3D model, one of the two models is an identical one and the other is a mirror one (left/right hand, e.g. planar symmetry). The only resulting 3D model which is different but satisfies all the constraints (no yellow face, no face marked in the attached figure) is positioned in the second row. 3D models that do not satisfy all constraints and differ more and more compared to the reference 3D model may be displayed in the following rows. The first 3D model of the third row has a different groove and the faces are marked accordingly (in yellow, marked by a "* Yellow") in this figure). The four holes and the boring (all faces marked by "* Yellow") are different in the next 3D model in the same row.

In the present example, the third axis is not used. The third axis may be used to represent other information such as versions, origin of issue, steps of manufacturing or any other classification of 3D models that it is of interest to the operator.

Understandably, the reference 3D model may be derived from an existing scanned component (part or mechanism) or a more or less roughly sketched 3D model by the operator on the screen. In the latter case, the operator may have omitted some details that appear nevertheless among searched 3D models. Such a display interface may allow the operator to switch from the initial reference 3D model to one of the resulting 3D models listed in the results of the search. When the reference 3D model is substituted, the operator may optionally maintain the previous comparison constraints or define new ones.

It shall be understood that the above described system of 3D model comparison may be a powerful tool in the search, the analysis, or the organization (classification, clustering or display) of 3D models. In many industries and other domains, the use of the system as well as the above described methods allow for the saving of time throughout the life cycle of the products, including at design and manufacturing stages of the products.

Figure 10:
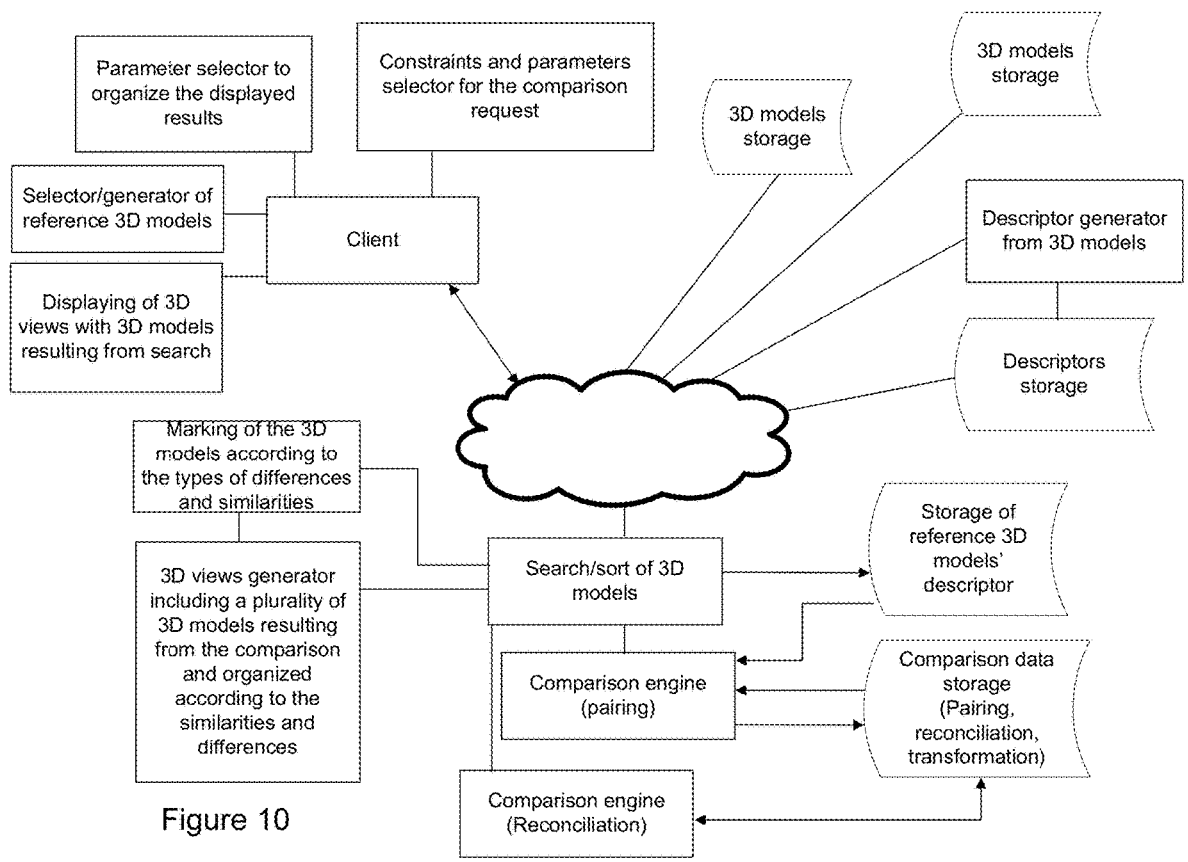
FIG. 10 shows a block diagram of a version of the computer system of FIG. 2 following a distributed architecture.

As shown in FIG. 10, the system in FIG. 2 may be deployed as a distributed system on multiple computers, the Web (the cloud), or on an intranet, allowing remote access to an operator, to data stores of 3D models, to stores of descriptors, to search and comparison engines, to marking systems or other add-ons. In the example in FIG. 10, search and comparison tasks are performed by a remote server from the operator workstation. Marking engine and the engine used to compute the associated 3D scene are on the search server. In other embodiments, the marking engine may run on client-side. The 3D scene and 3D models are sent to the operator for use in a browser (web browser) for example. Similarly, according to the illustration, storage of descriptors is remotely hosted. The generation of the descriptors may constitute a separate service for 3D models data stores. The system of FIG. 10 shows also three data stores at different location, separate from 3D models.

The use of such a system allows an operator to browse, search, and compare 3D models of a plurality of sources from a single client workstation.

The use of such a system allows an operator to upload his existing 3D models for the purpose of generation of descriptors using a remote service, whether his 3D models are for search and comparison by him and him alone, or for a search and comparison made by others also.

TABLE 1

Value of the characteristics of the descriptor for the 3D model of FIG. 6A:

| Mod. 3D | Type | Type_Par | Int N | Int N-1 | Gx | Gy | Gz | M1 | M2 | M3 | A1x |
|---|---|---|---|---|---|---|---|---|---|---|---|
| 1 | Body | 18 | 133839 | 29137 | 0 | 26 | 14 | 73210 | 35529 | 411546 | 0 |
| 1.1 | Plane | 0; 0; 1; 0 | 5128 | 715.863 | 0.00 | 35.33 | 0.00 | 22053 | 150403 | 172456 | 0.00 |
| 1.2 | Plane | 0; 0; 1; 30 | 2968 | 442.953 | 0.00 | −5.95 | 30.00 | 12304 | 20464 | 32769 | 1.00 |
| 1.3 | Plane | 0; .27; .96; 39.8 | 1266 | 171.393 | 0.00 | 70.44 | 21.30 | 427 | 4232 | 4659 | 0.00 |
| 1.4 | Plane | 0; 0; 1; 20 | 942 | 188.496 | 0.00 | 120.00 | 20.00 | 1178 | 1178 | 2356 | 1.00 |
| 1.5 | Cyl_int | 0; 0; 0; 0; 0; 1; 20 | 3770 | 251.327 | 0.00 | 0.00 | 15.00 | 10367 | 10367 | 15080 | 1.00 |
| 1.6 | Cyl_int | 0; 120; 0; 0; 0; 1; 10 | 1257 | 125.664 | 0.00 | 120.00 | 10.00 | 1047 | 1047 | 1257 | 1.00 |
| 1.7 | Plane | 1; 0; 0; 50 | 600 | 100 | 50.00 | −20.00 | 15.00 | 200 | 450 | 650 | 0.00 |
| 1.8 | Plane | 0; 1; 0; −10 | 600 | 100 | 40.00 | −10.00 | 15.00 | 200 | 450 | 650 | 0.00 |
| 1.9 | Plane | 1; 0; 0; 30 | 300 | 80 | 30.00 | −5.00 | 15.00 | 25 | 225 | 250 | 0.00 |
| 1.10 | Cyl_ext | 0; 0; 0; 0; 0; 1; 30 | 1108 | 133.858 | 22.98 | 16.25 | 15.00 | 861 | 1197 | 1998 | −0.58 |
| 1.11 | Plane | 1; 0; 0; 10 | 167 | 193.39 | 10.00 | 60.00 | 11.97 | 824 | 7214 | 8038 | 0.00 |
| 1.12 | Cyl_ext | 0; 120; 0; 0; 0; 1; 20 | 2249 | 275.584 | 0.00 | 122.24 | 10.43 | 4710 | 5686 | 8898 | 1.00 |
| 1.13 | Plane | 1; 0; 0 ; −10 | 1671 | 193.39 | −10.00 | 60.00 | 11.97 | 824 | 7214 | 8038 | 0.00 |
| 1.14 | Cyl_ext | 0; 0; 0; 0; 0; 1; 30 | 1108 | 133.858 | −22.98 | 16.25 | 15.00 | 861 | 1197 | 1998 | 0.58 |
| 1.15 | Plane | 1; 0; 0; −30 | 300 | 80 | −30.00 | −5.00 | 15.00 | 25 | 225 | 250 | 0.00 |
| 1.16 | Plane | 0; 1; 0; −10 | 600 | 100 | −40.00 | −10.00 | 15.00 | 200 | 450 | 650 | 0.00 |
| 1.17 | Plane | 1; 0; 0; −50 | 600 | 100 | −50.00 | −20.00 | 15.00 | 200 | 450 | 650 | 0.00 |
| 1.18 | Plane | 0; 1; 0; −30 | 3000 | 260 | 0.00 | −30.00 | 15.00 | 2250 | 25000 | 27250 | 1.00 |

| Mod. 3D | A1y | A1z | A2x | A2y | A2z | A3x | A3y | A3z | Bx | By | Bz |
|---|---|---|---|---|---|---|---|---|---|---|---|
| 1 | 1 | 0 | −1 | 0 | 0 | 0 | 0 | 1 | 171 | 100 | 33 |
| 1.1 | 1.00 | 0.00 | 1.00 | 0.00 | 0.00 | 0.00 | 0.00 | −1.00 | 170 | 100 | 0 |
| 1.2 | 0.00 | 0.00 | 0.00 | 1.00 | 0.00 | 0.00 | 0.00 | 1.00 | 100 | 70 | 0 |
| 1.3 | 0.96 | −0.28 | −1.00 | 0.00 | 0.00 | 0.00 | 0.28 | 0.96 | 65 | 20 | 0 |
| 1.4 | 0.00 | 0.00 | 0.00 | 1.00 | 0.00 | 0.00 | 0.00 | 1.00 | 40 | 40 | 0 |
| 1.5 | 0.00 | 0.00 | 0.00 | 1.00 | 0.00 | 0.00 | 0.00 | 1.00 | 40 | 40 | 30 |
| 1.6 | 0.00 | 0.00 | 0.00 | 1.00 | 0.00 | 0.00 | 0.00 | 1.00 | 20 | 20 | 20 |
| 1.7 | 0.00 | 1.00 | 0.00 | 1.00 | 0.00 | −1.00 | 0.00 | 0.00 | 30 | 20 | 0 |
| 1.8 | 0.00 | 1.00 | 1.00 | 0.00 | 0.00 | 0.00 | 1.00 | 0.00 | 30 | 20 | 0 |
| 1.9 | 0.00 | 1.00 | 0.00 | 1.00 | 0.00 | −1.00 | 0.00 | 0.00 | 30 | 10 | 0 |
| 1.10 | 0.82 | 0.00 | 0.00 | 0.00 | −1.00 | −0.82 | −0.58 | 0.00 | 35 | 30 | 6 |
| 1.11 | 0.99 | −0.15 | 0.00 | −0.15 | −0.99 | −1.00 | 0.00 | 0.00 | 78 | 31 | 0 |
| 1.12 | 0.00 | 0.00 | 0.00 | −1.00 | 0.07 | 0.00 | −0.07 | −1.00 | 40 | 41 | 22 |
| 1.13 | 0.99 | −0.15 | 0.00 | −0.15 | −0.99 | −1.00 | 0.00 | 0.00 | 78 | 31 | 0 |
| 1.14 | 0.82 | 0.00 | 0.00 | 0.00 | −1.00 | −0.82 | 0.58 | 0.00 | 35 | 30 | 6 |
| 1.15 | 0.00 | 1.00 | 0.00 | 1.00 | 0.00 | −1.00 | 0.00 | 0.00 | 30 | 10 | 0 |
| 1.16 | 0.00 | 1.00 | 1.00 | 0.00 | 0.00 | 0.00 | 1.00 | 0.00 | 30 | 20 | 0 |
| 1.17 | 0.00 | 1.00 | 0.00 | 1.00 | 0.00 | −1.00 | 0.00 | 0.00 | 30 | 20 | 0 |
| 1.18 | 0.00 | 0.00 | 0.00 | 0.00 | 1.00 | 0.00 | −1.00 | 0.00 | 100 | 30 | 0 |

TABLE 2

Value of the characteristics of the descriptor for the 3D model of FIG. 6B:

| Mod. 3D | Type | Type_Par | Int N | Int N-1 | Gx | Gy | Gz | M1 | M2 | M3 | A1x |
|---|---|---|---|---|---|---|---|---|---|---|---|
| 2 | Body | 19 | 140437 | 31830 | −54.8 | −99.3 | 13 | 62259 | 536376 | 581626 | 0.5 |
| 2.1 | Plane | 0; 0; 1; 0 | 5728 | 775.863 | −48.47 | −88.31 | 0.00 | 19562 | 235031 | 254593 | 0.49 |
| 2.2 | Plane | 0; 0; 1; 30 | 2679 | 451.327 | −76.17 | −138.65 | 30.00 | 8411 | 19104 | 27515 | 1.00 |
| 2.3 | Plane | 0.08; 0.14; 0.98; 8.22 | 2057 | 253.04 | −34.92 | −60.49 | 19.97 | 693 | 18133 | 18826 | 0.49 |
| 2.4 | Plane | 0; 0; 1; 20 | 942 | 188.496 | 0.00 | 0.00 | 20.00 | 1178 | 1178 | 2356 | 1.00 |
| 2.5 | Cyl_int | 0; −75; −129.9; 0; 0; 1; 20 | 3770 | 251.327 | −75.00 | −129.90 | 15.00 | 10367 | 10367 | 1508 | 1.00 |
| 2.6 | Cyl_int | 0; 0; 0; 0; 0; 1; 10 | 1257 | 125.664 | 0.00 | 0.00 | 10.00 | 1047 | 1047 | 1257 | 1.00 |
| 2.7 | Plane | 1; 0; 0; −25 | 600 | 100 | −25.00 | −149.90 | 15.00 | 200 | 450 | 650 | 0.00 |
| 2.8 | Plane | 0; 1; 0; −139.9 | 600 | 100 | −35.00 | −139.90 | 15.00 | 200 | 450 | 650 | 0.00 |
| 2.9 | Plane | 1; 0; 0; −45 | 300 | 80 | −45.00 | −134.90 | 15.00 | 25 | 225 | 250 | 0.00 |
| 2.10 | Cyl_ext | 0; −75; −129.9; 0; 0; 1; 30 | 2248 | 305.745 | −78.79 | −112.45 | 15.20 | 3748 | 12757 | 13067 | 1.00 |
| 2.11 | Plane | 0.866; −0.5; 0; 10 | 2080 | 250.1 | −29.90 | −71.79 | 10.59 | 813 | 17814 | 18627 | 0.50 |
| 2.12 | Cyl_ext | 0; 0; 20; 0; 0; 1; 20 | 2272 | 273.793 | 1.01 | 1.76 | 10.45 | 4814 | 5693 | 9009 | 0.87 |
| 2.13 | Plane | 0.866; −0.5; 0; −10 | 2080 | 250.1 | −47.22 | −61.79 | 10.59 | 813 | 17814 | 18627 | 0.50 |
| 2.15 | Plane | 1; 0; 0; −105 | 300 | 80 | −105.00 | −134.90 | 15.00 | 25 | 225 | 250 | 0.00 |
| 2.16 | Plane | 0; 1; 0; −139.9 | 600 | 100 | −115.00 | −139.90 | 15.00 | 200 | 450 | 650 | 0.00 |
| 2.17 | Plane | 1; 0; 0; −125 | 600 | 100 | −125.00 | −149.90 | 15.00 | 200 | 450 | 650 | 0.00 |
| 2.18 | Plane | 0; 1; 0; −159.9 | 3000 | 260 | −75.00 | −159.90 | 15.00 | 2250 | 25000 | 27250 | 1.00 |
| 2.19 | Cyl_int | −35; −149.9; 30; 0; 0; −1; 5 | 628 | 62.832 | −35.00 | −149.90 | 20.00 | 157 | 288 | 288 | 0.00 |
| 2.20 | Cone_int | −35; −149.9; 10; 0; 0; −1; 5; 2.3 | 91 | 31.416 | −35.00 | −149.90 | 9.04 | 6 | 6 | 11 | 1.00 |

| Mod. 3D | A1y | A1z | A2x | A2y | A2z | A3x | A3y | A3z | Bx | By | Bz |
|---|---|---|---|---|---|---|---|---|---|---|---|
| 2 | 0.86 | −0.04 | −0.86 | 0.5 | −0.01 | 0.01 | 0.04 | 0.99 | 222 | 97 | 33 |
| 2.1 | 0.87 | 0.00 | −0.87 | 0.49 | 0.00 | 0.00 | 0.00 | 1.00 | 221 | 97 | 0 |
| 2.2 | 0.03 | 0.00 | 0.03 | −1.00 | 0.00 | 0.00 | 0.00 | −1.00 | 101 | 62 | 0 |
| 2.3 | 0.85 | −0.16 | −0.87 | 0.50 | 0.00 | 0.08 | 0.14 | 0.99 | 106 | 20 | 0 |
| 2.4 | 0.00 | 0.00 | 0.00 | 1.00 | 0.00 | 0.00 | 0.00 | 1.00 | 40 | 40 | 0 |
| 2.5 | 0.00 | 0.00 | 0.00 | 1.00 | 0.00 | 0.00 | 0.00 | 1.00 | 40 | 40 | 30 |
| 2.6 | 0.00 | 0.00 | 0.00 | 1.00 | 0.00 | 0.00 | 0.00 | 1.00 | 20 | 20 | 20 |
| 2.7 | 0.00 | 1.00 | 0.00 | 1.00 | 0.00 | −1.00 | 0.00 | 0.00 | 30 | 20 | 0 |
| 2.8 | 0.00 | 1.00 | 1.00 | 0.00 | 0.00 | 0.00 | 1.00 | 0.00 | 30 | 20 | 0 |
| 2.9 | 0.00 | 1.00 | 0.00 | 1.00 | 0.00 | −1.00 | 0.00 | 0.00 | 30 | 10 | 0 |
| 2.10 | −0.07 | 0.01 | −0.07 | −0.99 | −0.14 | 0.02 | 0.14 | −0.99 | 60 | 36 | 34 |
| 2.11 | 0.86 | −0.09 | −0.04 | −0.08 | −1.00 | −0.87 | 0.50 | 0.00 | 106 | 29 | 0 |
| 2.12 | −0.50 | 0.00 | −0.50 | −0.86 | 0.07 | −0.03 | −0.06 | −1.00 | 40 | 41 | 22 |
| 2.13 | 0.86 | −0.09 | −0.04 | −0.08 | −1.00 | −0.87 | 0.50 | 0.00 | 106 | 29 | 0 |
| 2.15 | 0.00 | 1.00 | 0.00 | 1.00 | 0.00 | −1.00 | 0.00 | 0.00 | 30 | 10 | 0 |
| 2.16 | 0.00 | 1.00 | 1.00 | 0.00 | 0.00 | 0.00 | 1.00 | 0.00 | 30 | 20 | 0 |
| 2.17 | 0.00 | 1.00 | 0.00 | 1.00 | 0.00 | −1.00 | 0.00 | 0.00 | 30 | 20 | 0 |
| 2.18 | 0.00 | 0.00 | 0.00 | 0.00 | 1.00 | 0.00 | −1.00 | 0.00 | 100 | 30 | 0 |
| 2.19 | 0.00 | 1.00 | 0.00 | 1.00 | 0.00 | −1.00 | 0.00 | 0.00 | 20 | 10 | 10 |
| 2.20 | 0.00 | 0.00 | 0.00 | 1.00 | 0.00 | 0.00 | 0.00 | 1.00 | 10 | 10 | 3 |

TABLE 3

Results after pairing of 3D models:

| Mod. 3D | Type | Int N | Int N-1 | M1 | M2 | M3 | Bx | By | Bz | Index App. |
|---|---|---|---|---|---|---|---|---|---|---|
| 1 | Body | 133839 | 29137 | 73210 | 35529 | 411546 | 171 | 100 | 33 | |
| 2 | Body | 140437 | 31830 | 62259 | 536376 | 581626 | 222 | 97 | 33 | |
| Index | | 1.00 | 0.98 | 0.96 | 0.92 | 0.12 | 0.83 | 0.87 | 0.98 | 0.99 | 0.85 |

TABLE 3-continued

Results after pairing of 3D models:

| Mod. 3D | Type | Int N | Int N-1 | M1 | M2 | M3 | Bx | By | Bz | Index App. |
|---|---|---|---|---|---|---|---|---|---|---|
| 1.1 | Plane | 5128 | 716 | 22053 | 150403 | 172456 | 170 | 100 | 0 | |
| 2.1 | Plane | 5728 | 776 | 19562 | 235031 | 254593 | 221 | 9 | 0 | |
| Index | | 1.00 | 0.94 | 0.96 | 0.94 | 0.78 | 0.81 | 0.87 | 0.98 | 1.00 | 0.92 |
| 1.2 | Plane | 2968 | 443 | 12304 | 20464 | 32769 | 100 | 70 | 0 | |
| 2.1 | Plane | 5728 | 776 | 19562 | 235031 | 254593 | 221 | 9 | 0 | |
| Index | | 1.00 | 0.68 | 0.73 | 0.77 | 0.16 | 0.23 | 0.62 | 0.84 | 1.00 | 0.67 |
| 1.3 | Plane | 1266 | 171 | 427 | 4232 | 4659 | 65 | 20 | 0 | |
| 2.3 | Plane | 2057 | 253 | 693 | 18133 | 18826 | 106 | 20 | 0 | |
| Index | | 1.00 | 0.76 | 0.81 | 0.76 | 0.38 | 0.40 | 0.76 | 1.00 | 0.87 | 0.75 |
| 1.4 | Plane | 942 | 188 | 1178 | 1178 | 2356 | 40 | 40 | 0 | |
| 2.4 | Plane | 942 | 188 | 1178 | 1178 | 2356 | 40 | 40 | 0 | |
| Index | | 1.00 | 1.00 | 1.00 | 1.00 | 1.00 | 1.00 | 1.00 | 1.00 | 1.00 | 1.00 |
| 1.5 | Cyl_int | 3770 | 251 | 10367 | 10367 | 15080 | 40 | 40 | 30 | |
| 2.5 | Cyl_int | 3770 | 251 | 10367 | 10367 | 15080 | 40 | 40 | 30 | |
| Index | | 1.00 | 1.00 | 1.00 | 1.00 | 1.00 | 1.00 | 1.00 | 1.00 | 1.00 | 1.00 |
| 1.6 | Cyl_int | 1257 | 126 | 1047 | 1047 | 1257 | 20 | 20 | 20 | |
| 2.6 | Cyl_int | 1257 | 126 | 1047 | 1047 | 1257 | 20 | 20 | 20 | |
| Index | | 1.00 | 1.00 | 1.00 | 1.00 | 1.00 | 1.00 | 1.00 | 1.00 | 1.00 | 1.00 |
| 1.7 | Plane | 600 | 100 | 200 | 450 | 650 | 30 | 20 | 0 | |
| 2.7 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.8 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.16 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.17 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 1.8 | Plane | 600 | 100 | 200 | 450 | 650 | 30 | 20 | 0 | |
| 2.7 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.8 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.16 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.17 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 1.9 | Plane | 300 | 80 | 25 | 225 | 250 | 30 | 10 | 0 | |
| 2.9 | Plane | 300 | 80 | 25 | 225 | 250 | 30 | 10 | 0 | |
| Index | | 1.00 | 1.00 | 1.00 | 1.00 | 1.00 | 1.00 | 1.00 | 1.00 | 1.00 | 1.00 |
| 2.15 | Plane | 300 | 80 | 25 | 225 | 250 | 30 | 10 | 0 | |
| Index | | 1.00 | 1.00 | 1.00 | 1.00 | 1.00 | 1.00 | 1.00 | 1.00 | 1.00 | 1.00 |
| 1.10 | Cyl_ext | 1108 | 134 | 861 | 1197 | 1998 | 35 | 30 | 6 | |
| 2.10 | Cyl_ext | 2248 | 306 | 3748 | 12757 | 13067 | 60 | 36 | 34 | |
| Index | | 1.00 | 0.66 | 0.61 | 0.37 | 0.17 | 0.27 | 0.73 | 0.91 | 0.28 | 0.56 |
| 1.11 | Plane | 1671 | 193 | 824 | 7214 | 8038 | 78 | 31 | 0 | |
| 2.11 | Plane | 2080 | 250 | 813 | 17814 | 18627 | 106 | 29 | 0 | |
| Index | | 1.00 | 0.89 | 0.87 | 0.99 | 0.58 | 0.60 | 0.85 | 0.95 | 0.00 | 0.75 |
| 2.13 | Plane | 2080 | 250 | 813 | 17814 | 18627 | 106 | 29 | 0 | |
| Index | | 1.00 | 0.89 | 0.87 | 0.99 | 0.58 | 0.60 | 0.85 | 0.95 | 0.00 | 0.75 |
| 1.12 | Cyl_ext | 2249 | 276 | 4710 | 5686 | 8898 | 40 | 41 | 22 | |
| 2.12 | Cyl_ext | 2272 | 274 | 4814 | 5693 | 9009 | 40 | 41 | 22 | |
| Index | | 1.00 | 0.99 | 1.00 | 0.99 | 1.00 | 0.99 | 1.00 | 1.00 | 1.00 | 1.00 |
| 1.13 | Plane | 1671 | 193 | 824 | 7214 | 8038 | 78 | 31 | 0 | |
| 2.11 | Plane | 2080 | 250 | 813 | 17814 | 18627 | 106 | 29 | 0 | |
| Index | | 1.00 | 0.89 | 0.87 | 0.99 | 0.58 | 0.60 | 0.85 | 0.95 | 0.00 | 0.75 |
| 2.13 | Plane | 2080 | 250 | 813 | 17814 | 18627 | 106 | 29 | 0 | |
| Index | | 1.00 | 0.89 | 0.87 | 0.99 | 0.58 | 0.60 | 0.85 | 0.95 | 0.00 | 0.75 |
| 1.14 | Cyl_ext | 1108 | 134 | 861 | 1197 | 1998 | 35 | 30 | 6 | |
| 2.10 | Cyl_ext | 2248 | 306 | 3748 | 12757 | 13067 | 60 | 36 | 34 | |
| Index | | 1.00 | 0.66 | 0.61 | 0.37 | 0.17 | 0.27 | 0.73 | 0.91 | 0.28 | 0.56 |
| 1.15 | Plane | 300 | 80 | 25 | 225 | 250 | 30 | 10 | 0 | |
| 2.9 | Plane | 300 | 80 | 25 | 225 | 250 | 30 | 10 | 0 | |
| Index | | 1.00 | 1.00 | 1.00 | 1.00 | 1.00 | 1.00 | 1.00 | 1.00 | 1.00 | 1.00 |
| 2.15 | Plane | 300 | 80 | 25 | 225 | 250 | 30 | 10 | 0 | |
| Index | | 1.00 | 1.00 | 1.00 | 1.00 | 1.00 | 1.00 | 1.00 | 1.00 | 1.00 | 1.00 |
| 1.16 | Plane | 600 | 100 | 200 | 450 | 650 | 30 | 20 | 0 | |
| 2.7 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.8 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.16 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 2.17 | Plane | 600 | 100 | 200 | 450 | 650 | 30 | 20 | 0 | |
| Index | | 1.00 | 1.00 | 1.00 | 1.00 | 1.00 | 1.00 | 1.00 | 1.00 | 1.00 | 1.00 |
| 1.17 | Plane | 600 | 100 | 200 | 450 | 650 | 30 | 20 | 0 | |

TABLE 3-continued

Results after pairing of 3D models:

| Mod. 3D | Type | Int N | Int N-1 | M1 | M2 | M3 | Bx | By | Bz | Index App. |
|---|---|---|---|---|---|---|---|---|---|---|
| 2.7 | Plane | 600 | 100 | 200 | 450 | 650 | 30 | 20 | 0 | |
| Index | 1.00 | 1.00 | 1.00 | 1.00 | 1.00 | 1.00 | 1.00 | 1.00 | 1.00 | 1.00 |
| 2.8 | Plane | 600 | 100 | 200 | 450 | 650 | 30 | 20 | 0 | |
| Index | 1.00 | 1.00 | 1.00 | 1.00 | 1.00 | 1.00 | 1.00 | 1.00 | 1.00 | 1.00 |
| 2.16 | Plane | 600 | 100 | 200 | 450 | 650 | 30 | 20 | 0 | |
| Index | 1.00 | 1.00 | 1.00 | 1.00 | 1.00 | 1.00 | 1.00 | 1.00 | 1.00 | 1.00 |
| 2.17 | Plane | 600 | 100 | 200 | 450 | 650 | 30 | 20 | 0 | |
| Index | 1.00 | 1.00 | 1.00 | 1.00 | 1.00 | 1.00 | 1.00 | 1.00 | 1.00 | 1.00 |
| 1.18 | Plane | 3000 | 260 | 2250 | 25000 | 27250 | 100 | 30 | 0 | |
| 2.18 | Plane | 3000 | 260 | 2250 | 25000 | 27250 | 100 | 30 | 0 | |
| Index | 1.00 | 1.00 | 1.00 | 1.00 | 1.00 | 1.00 | 1.00 | 1.00 | 1.00 | 1.00 |
| 1.-- | — | — | — | — | — | — | — | — | — | |
| 2.19 | Cyl_int | 628 | 63 | 157 | 288 | 288 | 20 | 10 | 10 | |
| Index | 0.00 | 0.00 | 0.00 | 0.00 | 0.00 | 0.00 | 0.00 | 0.00 | 0.00 | 0.00 |
| 1.-- | — | — | — | — | — | — | — | — | — | |
| 2.20 | Cone_int | 91 | 31 | 6 | 6 | 11 | 10 | 10 | 3 | |
| Index | 0.00 | 0.00 | 0.00 | 0.00 | 0.00 | 0.00 | 0.00 | 0.00 | 0.00 | 0.00 |

TABLE 4

Results after pairing and reconciliation of 3D models:

| Mod. 3D | Type | Type_Par | Gx | Gy | Gz | A1x | A1y | A1z |
|---|---|---|---|---|---|---|---|---|
| 1 | Body | 18 | 0.00 | 25.80 | 13.60 | 0.00 | 1.00 | 0.04 |
| 2 | Body | 19 | 2.147 | 6.539 | 13.002 | 0.00 | 1.00 | −0.04 |
| Index | 1 | 0.97 | 0.98 | 0.91 | 0.98 | 1.00 | 1.00 | 0.94 |
| 1.1 | Plane | 0; 0; 1; 0 | 0.00 | 35.33 | 0.00 | 0.00 | 1.00 | 0.00 |
| 2.1 | Plane | 0; 0; 1; 0 | 2.18 | 29.29 | 0.00 | −0.01 | 1.00 | 0.00 |
| Index | 1 | 1.00 | 0.98 | 0.92 | 1.00 | 0.99 | 1.00 | 1.00 |
| 1.2 | Plane | 0; 0; 1; 30 | 0.00 | −5.95 | 30.00 | 1.00 | 0.00 | 0.00 |
| 2.2 | Plane | 0; 0; 1; 30 | −1.17 | −8.75 | 30.00 | 1.00 | 0.03 | 0.00 |
| Index | 1 | 1.00 | 0.99 | 0.99 | 1.00 | 1.00 | 0.98 | 1.00 |
| 1.3 | Plane | 0;.27;.95;39.8 | 0.00 | 70.44 | 21.30 | 0.00 | 0.96 | −0.28 |
| 2.3 | Plane | 0; 0; 164; 0.986;27.948 | 0.00 | 50.15 | 19.97 | 0.00 | 0.99 | −0.16 |
| Index | 1 | 0.00 | 1.00 | 0.90 | 0.96 | 1.00 | 0.98 | 0.91 |
| 1.4 | Plane | 0; 0; 1; 20 | 0.00 | 120.00 | 20.00 | 1.00 | 0.00 | 0.00 |
| 2.4 | Plane | 0; 0; 1; 20 | 0.00 | 120.00 | 20.00 | 1.00 | 0.00 | 0.00 |
| Index | 1 | 1.00 | 1.00 | 1.00 | 1.00 | 1.00 | 1.00 | 1.00 |
| 1.5 | Cyl_int | 0; 0; 0; 0; 0; 1; 20 | 0.00 | 0.00 | 15.00 | 1.00 | 0.00 | 0.00 |
| 2.5 | Cyl_int | 0; 0; 0; 0; 0; 1; 20 | 0.00 | 0.00 | 15.00 | 1.00 | 0.00 | 0.00 |
| Index | 1 | 1.00 | 1.00 | 1.00 | 1.00 | 1.00 | 1.00 | 1.00 |
| 1.6 | Cyl_int | 0; 120; 0; 0; 0; 1; 10 | 0.00 | 120.00 | 10.00 | 1.00 | 0.00 | 0.00 |
| 2.6 | Cyl_int | 0; 120; 0; 0; 0; 1; 10 | 0.00 | 120.00 | 10.00 | 1.00 | 0.00 | 0.00 |
| Index | 1 | 1.00 | 1.00 | 1.00 | 1.00 | 1.00 | 1.00 | 1.00 |
| 1.7 | Plant | 1; 0; 0; 50 | 50.00 | −20.00 | 15.00 | 0.00 | 0.00 | 1.00 |
| 2.7 | Plane | 1; 0; 0; 50 | 50.00 | −20.00 | 15.00 | 0.00 | 0.00 | 1.00 |
| Index | 1 | 1.00 | 1.00 | 1.00 | 1.00 | 1.00 | 1.00 | 1.00 |
| 1.8 | Plane | 0; 1; 0; −10 | 40.00 | −10.00 | 15.00 | 0.00 | 0.00 | 1.00 |
| 2.8 | Plane | 0; 1; 0; −10 | 40.00 | −10.00 | 15.00 | 0.00 | 0.00 | 1.00 |
| Index | 1 | 1.00 | 1.00 | 1.00 | 1.00 | 1.00 | 1.00 | 1.00 |
| 1.9 | Plane | 1; 0; 0; 30 | 30.00 | −5.00 | 15.00 | 0.00 | 0.00 | 1.00 |
| 2.9 | Plane | 1; 0; 0; 30 | 30.00 | −5.00 | 15.00 | 0.00 | 0.00 | 1.00 |
| Index | 1 | 1.00 | 1.00 | 1.00 | 1.00 | 1.00 | 1.00 | 1.00 |
| 1.10 | Cyl_ext | 0; 0; 0; 0; 0; 1; 30 | 22.98 | 16.25 | 15.00 | −0.58 | 0.82 | 0.00 |
| 2.10 | Cyl_ext | 0; 0; 0; 0; 0; 1; 30 | −3.79 | 17.45 | 15.20 | 1.00 | 0.07 | 0.01 |
| Index | 1 | 1.00 | 0.79 | 0.99 | 0.99 | 0.41 | 0.99 | |
| 1.11 | Plane | 1; 0; 0; 10 | 10.00 | 60.00 | 11.97 | 0.00 | 0.99 | −0.15 |
| 2.11 | Plane | 1; 0; 0; 10 | 10.00 | 42.88 | 10.59 | 0.00 | 1.00 | −0.09 |
| Index | 1 | 1.00 | 1.00 | 0.92 | 0.95 | 1.00 | 1.00 | 0.95 |
| 1.12 | Cyl_ext | 0; 120; 0; 0; 0; 1; 20 | 0.00 | 122.24 | 10.43 | 1.00 | 0.00 | 0.00 |
| 2.12 | Cyl_ext | 0; 120; 0; 0; 0; 1; 20 | 0.00 | 122.03 | 10.45 | 1.00 | 0.00 | 0.00 |
| Index | 1 | 1.00 | 1.00 | 1.00 | 1.00 | 1.00 | 1.00 | 1.00 |
| 1.13 | Plane | 1; 0; 0; −10 | −10.00 | 60.00 | 11.97 | 0.00 | 0.99 | −0.15 |
| 2.13 | Plane | 1; 0; 0; −10 | −10.00 | 42.88 | 10.59 | 0.00 | 1.00 | −0.09 |
| Index | 1 | 1.00 | 1.00 | 0.92 | 0.95 | 1.00 | 1.00 | 0.95 |
| 1.14 | Cyl_ext | 0; 0; 0; 0; 0; 1; 30 | −22.98 | 16.25 | 15.00 | 0.58 | 0.82 | 0.00 |
| 2.14 | Cyl_ext | 0; 0; 0; 0; 0; 1; 30 | −3.79 | 17.45 | 15.20 | 1.00 | −0.07 | 0.01 |
| Index | 1 | 1.00 | 0.85 | 0.99 | 0.99 | 0.73 | 0.41 | 0.99 |
| 1.15 | Plane | 1; 0; 0; −30 | −30.00 | −5.00 | 15.00 | 0.00 | 0.00 | 1.00 |

TABLE 4-continued

Results after pairing and reconciliation of 3D models:

| Mod.3D | Type | Type_Par | Gx | Gy | Gz | A1x | A1y | A1z |
|---|---|---|---|---|---|---|---|---|
| 2.15 | Plane | 1; 0; 0; −30 | −30.00 | −5.00 | 15.00 | 0.00 | 0.00 | 1.00 |
| Index | 1 | | 1.00 | 1.00 | 1.00 | 1.00 | 1.00 | 1.00 |
| 1.16 | Plane | 0; 1; 0; −10 | −40.00 | −10.00 | 15.00 | 0.00 | 0.00 | 1.00 |
| 2.16 | Plane | 0; 1; 0; −10 | −40.00 | −10.00 | 15.00 | 0.00 | 0.00 | 1.00 |
| Index | 1 | | 1.00 | 1.00 | 1.00 | 1.00 | 1.00 | 1.00 |
| 1.18 | Plane | 0; 1; 0; −30 | 0.00 | −30.00 | 15.00 | 1.00 | 0.00 | 0.00 |
| 2.18 | Plane | 0; 1; 0; −30 | 0.00 | −30.00 | 15.00 | 1.00 | 0.00 | 0.00 |
| Index | 1 | | 1.00 | 1.00 | 1.00 | 1.00 | 1.00 | 1.00 |

| Mod.3D | A2x | A2y | A2z | A3x | A3y | A3z | Matrix | Index |
|---|---|---|---|---|---|---|---|---|
| 1 | −1.00 | 0.00 | 0.00 | 0.00 | 0.04 | 1.00 | | |
| 2 | −1.00 | 0.00 | −0.01 | −0.01 | 0.04 | 0.99 | 2 | |
| Index | 1.00 | 1.00 | 1.00 | 1.00 | 1.00 | 1.00 | | 0.98 |
| 1.1 | 1.00 | 0.00 | 0.00 | 0.00 | 0.00 | −1.00 | | |
| 2.1 | −1.00 | −0.01 | 0.00 | 0.00 | 0.00 | 1.00 | 2 | |
| Index | 0.00 | 1.00 | 1.00 | 1.00 | 1.00 | 0.00 | | 0.85 |
| 1.2 | 0.00 | 1.00 | 0.00 | 0.00 | 0.00 | 1.00 | | |
| 2.1 | 0.03 | −1.00 | 0.00 | 0.00 | 0.00 | −1.00 | 1 | |
| Index | 0.98 | 0.00 | 1.00 | 1.00 | 1.00 | 0.00 | | 0.85 |
| 1.3 | −1.00 | 0.00 | 0.00 | 0.00 | 0.28 | 0.96 | | |
| 2.3 | −1.00 | 0.00 | 0.00 | 0.00 | 0.16 | 0.99 | 2 | |
| Index | 1.00 | 1.00 | 1.00 | 1.00 | 0.94 | 0.99 | | 0.91 |
| 1.4 | 0.00 | 1.00 | 0.00 | 0.00 | 0.00 | 1.00 | | |
| 2.4 | 0.00 | 1.00 | 0.00 | 0.00 | 0.00 | 1.00 | | |
| Index | 1.00 | 1.00 | 1.00 | 1.00 | 1.00 | 1.00 | 2 | 1.00 |
| 1.5 | 0.00 | 1.00 | 0.00 | 0.00 | 0.00 | 1.00 | | |
| 2.5 | 0.00 | 1.00 | 0.00 | 0.00 | 0.00 | 1.00 | 1 | |
| Index | 1.00 | 1.00 | 1.00 | 1.00 | 1.00 | 1.00 | | 1.00 |
| 1.6 | 0.00 | 1.00 | 0.00 | 0.00 | 0.00 | 1.00 | | |
| 2.6 | 0.00 | 1.00 | 0.00 | 0.00 | 0.00 | 1.00 | 2 | |
| Index | 1.00 | 1.00 | 1.00 | 1.00 | 1.00 | 1.00 | | 1.00 |
| 1.7 | 0.00 | 1.00 | 0.00 | −1.00 | 0.00 | 0.00 | | |
| 2.7 | 0.00 | 1.00 | 0.00 | −1.00 | 0.00 | 0.00 | 1 | |
| Index | 1.00 | 1.00 | 1.00 | 1.00 | 1.00 | 1.00 | | 1.00 |
| 1.8 | 1.00 | 0.00 | 0.00 | 0.00 | 1.00 | 0.00 | | |
| 2.8 | 1.00 | 0.00 | 0.00 | 0.00 | 1.00 | 0.00 | 1 | |
| Index | 1.00 | 1.00 | 1.00 | 1.00 | 1.00 | 1.00 | | 1.00 |
| 1.9 | 0.00 | 1.00 | 0.00 | −1.00 | 0.00 | 0.00 | | |
| 2.9 | 0.00 | 1.00 | 0.00 | −1.00 | 0.00 | 0.00 | 1 | |
| Index | 1.00 | 1.00 | 1.00 | 1.00 | 1.00 | 1.00 | | 1.00 |
| 1.10 | 0.00 | 0.00 | −1.00 | −0.82 | −0.58 | 0.00 | | |
| 2.10 | −0.07 | −0.99 | −0.14 | 0.02 | 0.14 | −0.99 | 1 | |
| Index | 0.97 | 0.51 | 0.57 | 0.55 | 0.64 | 0.51 | | 0.71 |
| 1.11 | 0.00 | −0.15 | −0.99 | −1.00 | 0.00 | 0.00 | | |
| 2.11 | 0.00 | −0.09 | −1.00 | −1.00 | 0.00 | 0.00 | 2 | |
| Index | 1.00 | 0.97 | 1.00 | 1.00 | 1.00 | 1.00 | | 0.98 |
| 1.12 | 0.00 | −1.00 | 0.07 | 0.00 | −0.07 | −1.00 | | |
| 2.12 | 0.00 | −1.00 | 0.07 | 0.00 | −0.07 | −1.00 | 2 | |
| Index | 1.00 | 1.00 | 1.00 | 1.00 | 1.00 | 1.00 | | 1.00 |
| 1.13 | 0.00 | −0.15 | −0.99 | −1.00 | 0.00 | 0.00 | | |
| 2.13 | 0.00 | −0.09 | −1.00 | −1.00 | 0.00 | 0.00 | 2 | |
| Index | 1.00 | 0.97 | 1.00 | 1.00 | 1.00 | 1.00 | | 0.98 |
| 1.14 | 0.00 | 0.00 | −1.00 | −0.82 | 0.58 | 0.00 | | |
| 2.14 | −0.07 | −0.99 | −0.14 | 0.02 | 0.14 | −0.99 | 1 | |
| Index | 1.97 | 0.51 | 1.57 | 0.55 | 0.78 | 0.51 | | 0.78 |
| 1.15 | 0.00 | 1.00 | 0.00 | −1.00 | 0.00 | 0.00 | | |
| 2.15 | 0.00 | 1.00 | 0.00 | −1.00 | 0.00 | 0.00 | 1 | |
| Index | 1.00 | 1.00 | 1.00 | 1.00 | 1.00 | 1.00 | | 1.00 |
| 1.16 | 1.00 | 0.00 | 0.00 | 0.00 | 1.00 | 0.00 | | |
| 2.16 | 1.00 | 0.00 | 0.00 | 0.00 | 1.00 | 0.00 | 1 | |
| Index | 1.00 | 1.00 | 1.00 | 1.00 | 1.00 | 1.00 | | 1.00 |
| 1.18 | 0.00 | 0.00 | 1.00 | 0.00 | −1.00 | 0.00 | | |
| 2.18 | 0.00 | 0.00 | 1.00 | 0.00 | −1.00 | 0.00 | 1 | |
| Index | 1.00 | 1.00 | 1.00 | 1.00 | 1.00 | 1.00 | | 1.00 |

TABLE 5

Results cleaned after pairing and reconciliation of 3D models (not final):

| Mod.3D | Type | Type_Par | Gx | Gy | Gz | A1x | A1y | A1z |
|---|---|---|---|---|---|---|---|---|
| 1 | Body | 18 | 0.00 | 25.80 | 13.60 | 0.00 | 1.00 | 0.04 |

TABLE 5-continued

Results cleaned after pairing and reconciliation of 3D models (not final):

| | | | | | | | | |
|---|---|---|---|---|---|---|---|---|
| 2 | Body | 19 | 20.129 | 30.57 | 13.002 | 0.5 | 0.87 | −0.04 |
| Index | 1 | 0.97 | 0.84 | 0.98 | 0.98 | 0.68 | 0.91 | 0.93 |
| 2 | Body | 19 | 2.147 | 6.539 | 13.002 | 0.00 | 1.00 | −0.04 |
| Index | 1 | 0.97 | 0.98 | 0.91 | 0.98 | 1.00 | 1.00 | 0.94 |
| 1.1 | Plane | 0; 0; 1; 0 | 0.00 | 35.33 | 0.00 | 0.00 | 1.00 | 0.00 |
| 2.1 | Plane | 0; 0; 1; 0 | 26.53 | 41.59 | 0.00 | 0.49 | 0.87 | 0.00 |
| Index | 1 | 1.00 | 0.79 | 0.97 | 1.00 | 0.69 | 0.91 | 1.00 |
| 2.1 | Plane | 0; 0; 1; 0 | 2.18 | 19.29 | 0.00 | −0.01 | 1.00 | 0.00 |
| Index | 1 | 1.00 | 0.98 | 0.92 | 1.00 | 0.99 | 1.00 | 1.00 |
| 1.2 | Plane | 0; 0; 1; 30 | 0.00 | −5.95 | 30.00 | 1.00 | 0.00 | 0.00 |
| 2.2 | Plane | 0; 0; 1; 30 | −1.17 | −8.75 | 30.00 | 1.00 | 0.03 | 0.00 |
| Index | 1 | 1.00 | 0.99 | 0.99 | 1.00 | 1.00 | 0.98 | 1.00 |
| 2.2 | Plane | 0; 0; 1; 30 | 3.36 | −38.16 | 30.00 | 0.85 | 0.53 | 0.00 |
| Index | 1 | 1.00 | 0.97 | 0.84 | 1.00 | 0.90 | 0.65 | 1.00 |
| 1.3 | Plane | 0; .27; .96; 39.8 | 0.00 | 70.44 | 21.30 | 0.00 | 0.96 | −0.28 |
| 2.3 | Plane | 0.08; 0.14; 0.98; 32.88 | 40.08 | 69.42 | 19.97 | 0.49 | 0.85 | −0.16 |
| Index | 1 | 0.00 | 0.68 | 0.99 | 0.96 | 0.69 | 0.93 | 0.91 |
| 2.3 | Plane | 0; 0.164; 0.986; 27.948 | 0.00 | 50.15 | 19.97 | 0.00 | 0.99 | −0.16 |
| Index | 1 | 0.00 | 1.00 | 0.90 | 0.96 | 1.00 | 0.98 | 0.91 |
| 1.4 | Plane | 0; 0; 1; 20 | 0.00 | 120.00 | 20.00 | 1.00 | 0.00 | 0.00 |
| 2.4 | Plane | 0; 0; 1; 20 | 75.00 | 129.90 | 20.00 | 1.00 | 0.00 | 0.00 |
| Index | 1 | 1.00 | 0.40 | 0.95 | 1.00 | 1.00 | 1.00 | 1.00 |
| 2.4 | Plane | 0; 0; 1; 20 | 0.00 | 120.00 | 20.00 | 1.00 | 0.00 | 0.00 |
| Index | 1 | 1.00 | 1.00 | 1.00 | 1.00 | 1.00 | 1.00 | 1.00 |
| 1.5 | Cyl_int | 0; 0; 0; 0; 0; 1; 20 | 0.00 | 0.00 | 15.00 | 1.00 | 0.00 | 0.00 |
| 2.5 | Cyl_int | 0; 0; 0; 0; 0; 1; 20 | 0.00 | 0.00 | 15.00 | 1.00 | 0.00 | 0.00 |
| Index | 1 | 1.00 | 1.00 | 1.00 | 1.00 | 1.00 | 1.00 | 1.00 |
| 2.5 | Cyl_int | 0; −30; 0; 0; 0; 1; 20 | 0.00 | −30.00 | 15.00 | 1.00 | 0.00 | 0.00 |
| Index | 1 | 0.86 | 1.00 | 0.85 | 1.00 | 1.00 | 1.00 | 1.00 |
| 1.6 | Cyl_int | 0; 120; 0; 0; 0; 1; 10 | 0.00 | 120.00 | 10.00 | 1.00 | 0.00 | 0.00 |
| 2.6 | Cyl_int | 75; 129; 9; 0; 0; 0; 1; 10 | 75.00 | 129.90 | 10.00 | 1.00 | 0.00 | 0.00 |
| Index | 1 | 0.57 | 0.40 | 0.95 | 1.00 | 1.00 | 1.00 | 1.00 |
| 2.6 | Cyl_int | 0; 120; 0; 0; 0; 1; 10 | 0.00 | 120.00 | 10.00 | 1.00 | 0.00 | 0.00 |
| Index | 1 | 1.00 | 1.00 | 1.00 | 1.00 | 1.00 | 1.00 | 1.00 |
| 1.7 | Plane | 1; 0; 0; 50 | 50.00 | −20.00 | 15.00 | 0.00 | 0.00 | 1.00 |
| 2.7 | Plane | 1; 0; 0; 50 | 50.00 | −20.00 | 15.00 | 0.00 | 0.00 | 1.00 |
| Index | 1 | 1.00 | 1.00 | 1.00 | 1.00 | 1.00 | 1.00 | 1.00 |
| 2.8 | Plane | 0; 1; 0; −10 | 40.00 | −10.00 | 15.00 | 0.00 | 0.00 | 1.00 |
| Index | 1 | 0.50 | 0.92 | 0.95 | 1.00 | 1.00 | 1.00 | 1.00 |
| 2.15 | Plane | 1; 0; 0; −30 | −30.00 | −5.00 | 15.00 | 0.00 | 0.00 | 1.00 |
| Index | 1 | 0.50 | 0.37 | 0.93 | 1.00 | 1.00 | 1.00 | 1.00 |
| 2.16 | Plane | 0; 1; 0; −10 | −40.00 | −10.00 | 15.00 | 0.00 | 0.00 | 1.00 |
| Index | 1 | 0.50 | 0.29 | 0.95 | 1.00 | 1.00 | 1.00 | 1.00 |
| 1.7 | Plane | 1; 0; 0; 50 | 50.00 | −20.00 | 15.00 | 0.00 | 0.00 | 1.00 |
| 2.7 | Plane | 0.866; 0.5; 0; 35 | 53.30 | −22.32 | 15.00 | 0.00 | 0.00 | 1.00 |
| Index | 1 | 0.00 | 0.97 | 0.99 | 1.00 | 0.00 | 0.00 | 1.00 |
| 2.8 | Plane | −0.5; 0.866; 0; −35.98 | 39.64 | −18.66 | 15.00 | 0.00 | 0.00 | 1.00 |
| Index | 1 | 0.00 | 0.92 | 0.99 | 1.00 | 1.00 | 1.00 | 1.00 |
| 2.15 | Plane | 0.866; 0.5; 0; −45 | −23.48 | −49.33 | 15.00 | 0.00 | 0.00 | 1.00 |
| Index | 1 | 0.00 | 0.42 | 0.86 | 1.00 | 1.00 | 1.00 | 1.00 |
| 2.16 | Plane | −0.5; 0.866; 0; −35.98 | −29.64 | −58.66 | 15.00 | 0.00 | 0.00 | 1.00 |

TABLE 5-continued

Results cleaned after pairing and reconciliation of 3D models (not final):

| Label | Type | Vector | V1 | V2 | V3 | V4 | V5 | V6 |
|---|---|---|---|---|---|---|---|---|
| Index | 1 | 0.00 | 0.37 | 0.81 | 1.00 | 1.00 | 1.00 | 1.00 |
| 1.8 | Plane | 0; 1; 0; −10 | 40.00 | −10.00 | 15.00 | 0.00 | 0.00 | 1.00 |
| 2.7 | Plane | 1; 0; 0; 50 | 50.00 | −20.00 | 15.00 | 0.00 | 0.00 | 1.00 |
| Index | 1 | 0.00 | 0.92 | 0.95 | 1.00 | 1.00 | 1.00 | 1.00 |
| 2.8 | Plane | 0; 1; 0; −10 | 40.00 | −10.00 | 15.00 | 0.00 | 0.00 | 1.00 |
| Index | 1 | 1.00 | 1.00 | 1.00 | 1.00 | 1.00 | 1.00 | 1.00 |
| 2.15 | Plane | 1; 0; 0; −30 | −30.00 | −5.00 | 15.00 | 0.00 | 0.00 | 1.00 |
| Index | 1 | 0.25 | 0.44 | 0.98 | 1.00 | 1.00 | 1.00 | 1.00 |
| 2.16 | Plane | 0; 1; 0; −10 | −40.00 | −10.00 | 15.00 | 0.00 | 0.00 | 1.00 |
| Index | 1 | 0.37 | 1.00 | 1.00 | 1.00 | 1.00 | 1.00 | 1.00 |
| 1.8 | Plane | 0; 1; 0; −10 | 40.00 | −10.00 | 15.00 | 0.00 | 0.00 | 1.00 |
| 2.7 | Plane | 0.866; 0.5; 0; 35 | 53.30 | −22.32 | 15.00 | 0.00 | 0.00 | 1.00 |
| Index | 1 | 0.00 | 0.89 | 0.94 | 1.00 | 1.00 | 1.00 | 1.00 |
| 2.8 | Plane | −0.5; 0.866; 0; −35.98 | 39.64 | −18.66 | 15.00 | 0.00 | 0.00 | 1.00 |
| Index | 1 | 0.00 | 1.00 | 0.96 | 1.00 | 1.00 | 1.00 | 1.00 |
| 2.15 | Plane | 0.866; 0.5; 0; −45 | −23.48 | −49.33 | 15.00 | 0.00 | 0.00 | 1.00 |
| Index | 1 | 0.00 | 0.50 | 0.81 | 1.00 | 1.00 | 1.00 | 1.00 |
| 2.16 | Plane | −0.5; 0.866; 0; −35.98 | −29.64 | −58.66 | 15.00 | 0.00 | 0.00 | 1.00 |
| Index | 1 | 0.00 | 0.45 | 0.76 | 1.00 | 1.00 | 1.00 | 1.00 |
| 1.9 | Plane | 1; 0; 0; 30 | 30.00 | −5.00 | 15.00 | 0.00 | 0.00 | 1.00 |
| 2.9 | Plane | 1; 0; 0; 30 | 30.00 | −5.00 | 15.00 | 0.00 | 0.00 | 1.00 |
| Index | 1 | 1.00 | 1.00 | 1.00 | 1.00 | 1.00 | 1.00 | 1.00 |
| 2.15 | Plane | 1; 0; 0; −30 | −30.00 | −5.00 | 15.00 | 0.00 | 0.00 | 1.00 |
| Index | 1 | 0.75 | 0.52 | 1.00 | 1.00 | 1.00 | 1.00 | 1.00 |
| 2.9 | Plane | 0.866; 0.5; 0; 15 | 28.48 | −19.33 | 15.00 | 0.00 | 0.00 | 1.00 |
| Index | 1 | 0.00 | 0.99 | 0.93 | 1.00 | 1.00 | 1.00 | 1.00 |
| 2.15 | Plane | 0.866; 0.5; 0; −45 | −23.48 | −49.33 | 15.00 | 0.00 | 0.00 | 1.00 |
| Index | 1 | 0.00 | 0.58 | 0.78 | 1.00 | 1.00 | 1.00 | 1.00 |
| 1.10 | Cyl_ext | 0; 0; 0; 0; 0; 1; 30 | 22.98 | 16.25 | 15.00 | −0.58 | 0.82 | 0.00 |
| 2.10 | Cyl_ext | 0; 0; 0; 0; 0; 1; 30 | −3.79 | 17.45 | 15.20 | 1.00 | −0.07 | 0.01 |
| Index | 1 | 0.79 | 0.99 | 0.99 | 0.00 | 0.41 | 0.99 | |
| 2.10 | Cyl_ext | 0; −30; 0; 0; 0; 1; 30 | −12.01 | −16.78 | 15.20 | 0.90 | 0.44 | 0.01 |
| Index | 1 | 0.72 | 0.84 | 0.99 | 0.07 | 0.75 | 0.99 | |
| 1.11 | Plane | 1; 0; 0; 10 | 10.00 | 60.00 | 11.97 | 0.00 | 0.99 | −0.15 |
| 2.11 | Plane | 0.866; −0.5; 0; 10 | 45.10 | 58.12 | 10.59 | 0.50 | 0.86 | −0.09 |
| Index | 1 | 0.25 | 0.72 | 0.99 | 0.95 | 0.68 | 0.92 | 0.95 |
| 2.13 | Plane | 0.866; −0.5; 0; −10 | 27.78 | 68.12 | 10.59 | 0.50 | 0.86 | −0.09 |
| Index | 1 | 0.00 | 0.86 | 0.96 | 0.95 | 0.68 | 0.92 | 0.95 |
| 2.11 | Plane | 1; 0; 0; 10 | 10.00 | 42.88 | 10.59 | 0.00 | 1.00 | −0.09 |
| Index | 1 | 1.00 | 0.92 | 0.95 | 1.00 | 1.00 | 0.95 | |
| 2.13 | Plane | 1; 0; 0; −10 | −10.00 | 42.88 | 10.59 | 0.00 | 1.00 | −0.09 |
| Index | 1 | 0.75 | 0.84 | 0.92 | 0.95 | 1.00 | 1.00 | 0.95 |
| 1.12 | Cyl_ext | 0; 120; 0; 0; 0; 1; 20 | 0.00 | 122.24 | 10.43 | 1.00 | 0.00 | 0.00 |
| 2.12 | Cyl_ext | 75; 129.9; 0; 0; 0; | 76.01 | 131.66 | 10.45 | 0.87 | −0.50 | 0.00 |

TABLE 5-continued

Results cleaned after pairing and reconciliation of 3D models (not final):

| Index | Type | Vector | | | | | | |
|---|---|---|---|---|---|---|---|---|
| Index 2.12 | 1 Cyl_ext | 0.25 0; 120; 0; 0; 0; 1; 20 | 0.40 0.00 | 0.95 122.03 | 1.00 10.45 | 0.92 1.00 | 0.67 0.00 | 1.00 0.00 |
| Index 1.13 | 1 Plane | 1.00 1; 0; 0; −10 | 1.00 −10.00 | 1.00 60.00 | 1.00 11.97 | 1.00 0.00 | 1.00 0.99 | 1.00 −0.15 |
| 2.11 | Plane | 0.866; −0.5; 0; 10 | 45.10 | 58.12 | 10.59 | 0.50 | 0.86 | −0.09 |
| Index 2.13 | 1 Plane | 0.50 0.866; −0.5; 0; −10 | 0.56 27.78 | 0.99 68.12 | 0.95 10.59 | 0.68 0.50 | 0.92 0.86 | 0.95 −0.09 |
| Index 2.11 | 1 Plane | 0.50 1; 0; 0; 10 | 0.70 10.00 | 0.96 42.88 | 0.95 10.59 | 0.68 0.00 | 0.92 1.00 | 0.95 −0.09 |
| Index 2.13 | 1 Plane | 0.75 1; 0; 0; −10 | 0.84 −10.00 | 0.92 42.88 | 0.95 10.59 | 1.00 0.00 | 1.00 1.00 | 0.95 −0.09 |
| Index 1.14 | 1 Cyl_ext | 1.00 0; 0; 0; 0; 1; 30 | 1.00 −22.98 | 0.92 16.25 | 0.95 15.00 | 1.00 0.58 | 1.00 0.82 | 0.95 0.00 |
| 2.10 | Cyl_ext | 0; 0; 0; 0; 0; 1; 30 | −3.79 | 17.45 | 15.20 | 1.00 | −0.07 | 0.01 |
| Index 2.10 | 1 Cyl_ext | 1.00 0; −30; 0; 0; 0; 1; 30 | 0.85 −12.01 | 0.99 −16.78 | 0.99 15.20 | 0.73 0.90 | 0.41 0.44 | 0.99 0.01 |
| Index 1.15 | 1 Plane | 0.75 1; 0; 0; −30 | 0.91 −30.00 | 0.84 −5.00 | 0.99 15.00 | 0.80 0.00 | 0.75 0.00 | 0.99 1.00 |
| 2.9 | Plane | 1; 0; 0; 30 | 30.00 | −5.00 | 15.00 | 0.00 | 0.00 | 1.00 |
| Index 2.15 | 1 Plane | 0.75 1; 0; 0; −30 | 0.52 −30.00 | 1.00 −5.00 | 1.00 15.00 | 1.00 0.00 | 1.00 0.00 | 1.00 1.00 |
| Index 2.9 | 1 Plane | 1.00 0.866; 0.5; 0; 15 | 1.00 28.48 | 1.00 −19.33 | 1.00 15.00 | 1.00 0.00 | 1.00 0.00 | 1.00 1.00 |
| Index 2.15 | 1 Plane | 0.25 0.866; 0.5; 0; −45 | 0.54 −23.48 | 0.93 −49.33 | 1.00 15.00 | 1.00 0.00 | 1.00 0.00 | 1.00 1.00 |
| Index 2.8 | 1 Plane | 0.25 0; 1; 0; −10 | 0.95 40.00 | 0.78 −10.00 | 1.00 15.00 | 1.00 0.00 | 1.00 0.00 | 1.00 1.00 |
| Index 2.16 | 1 Plane | 1.00 0; 1; 0; −10 | 0.37 −40.00 | 1.00 −10.00 | 1.00 15.00 | 1.00 0.00 | 1.00 0.00 | 1.00 1.00 |
| Index 2.17 | 1 Plane | 1.00 1; 0; 0; −50 | 1.00 −50.00 | 1.00 −20.00 | 1.00 15.00 | 1.00 0.00 | 1.00 0.00 | 1.00 1.00 |
| Index 2.7 | 1 Plane | 0.75 1; 0; 0; 50 | 0.92 50.00 | 0.95 −20.00 | 1.00 15.00 | 1.00 0.00 | 1.00 0.00 | 1.00 1.00 |
| Index 2.8 | 1 Plane | 0.25 0; 1; 0; −10 | 0.29 40.00 | 0.95 −10.00 | 1.00 15.00 | 1.00 0.00 | 1.00 0.00 | 1.00 1.00 |
| Index 2.16 | 1 Plane | 1.00 −0.5; 0.866; 0; −35.98 | 0.37 −29.64 | 1.00 −58.66 | 1.00 15.00 | 1.00 0.00 | 1.00 0.00 | 1.00 1.00 |
| Index 2.17 | 1 Plane | 0.25 0.866; 0.5; 0; −65 | 0.92 −33.30 | 0.76 −72.32 | 1.00 15.00 | 1.00 0.00 | 1.00 0.00 | 1.00 1.00 |
| Index 1.18 | 1 Plane | 0.25 0; 1; 0; −30 | 0.95 0.00 | 0.69 −30.00 | 1.00 15.00 | 1.00 1.00 | 1.00 0.00 | 1.00 0.00 |
| 2.18 | Plane | 0; 1; 0; −30 | 0.00 | −30.00 | 15.00 | 1.00 | 0.00 | 0.00 |
| Index 2.18 | 1 Plane | 1.00 −0.5; | 1.00 15.00 | 1.00 −55.98 | 1.00 15.00 | 1.00 0.87 | 1.00 0.50 | 1.00 0.00 |

TABLE 5-continued

Results cleaned after pairing and reconciliation of 3D models (not final):

| Index | 1 | 0.866;<br>0; −55.98<br>0.25 | 0.88 | 0.87 | 1.00 | 0.92 | 0.67 | 1.00 |
|---|---|---|---|---|---|---|---|---|

| Mod. 3D | A2x | A2y | A2z | A3x | A3y | A3z | Matrix | Index |
|---|---|---|---|---|---|---|---|---|
| 1 | −1.00 | 0.00 | 0.00 | 0.00 | 0.04 | 1.00 | | |
| 2 | −0.88 | 0.5 | −0.01 | 0.01 | 0.04 | 0.99 | 1 | |
| Index | 0.94 | 0.75 | 1.00 | 0.99 | 1.00 | 1.00 | | 0.93 |
| 2 | −1.00 | 0.00 | −0.01 | −0.01 | 0.04 | 0.99 | 2 | |
| Index | 1.00 | 1.00 | 1.00 | 1.00 | 1.00 | 1.00 | | 0.98 |
| 1.1 | 1.00 | 0.00 | 0.00 | 0.00 | 0.00 | −1.00 | | |
| 2.1 | −0.87 | 0.49 | 0.00 | 0.00 | 0.00 | 1.00 | 1 | |
| Index | 0.06 | 0.75 | 1.00 | 1.00 | 1.00 | 0.00 | | 0.80 |
| 2.1 | −1.00 | −0.01 | 0.00 | 0.00 | 0.00 | 1.00 | 2 | |
| Index | 0.00 | 1.00 | 1.00 | 1.00 | 1.00 | 0.00 | | 0.85 |
| 1.2 | 0.00 | 1.00 | 0.00 | 0.00 | 0.00 | 1.00 | | |
| 2.2 | 0.03 | −1.00 | 0.00 | 0.00 | 0.00 | −1.00 | 1 | |
| Index | 0.98 | 0.00 | 1.00 | 1.00 | 1.00 | 0.00 | | 0.85 |
| 2.2 | 0.53 | −0.85 | 0.00 | 0.00 | 0.00 | 1.00 | 2 | |
| Index | 0.74 | 0.07 | 1.00 | 1.00 | 1.00 | 0.00 | | 0.80 |
| 1.3 | −1.00 | 0.00 | 0.00 | 0.00 | 0.28 | 0.96 | | |
| 2.3 | −0.87 | 0.50 | 0.00 | 0.08 | 0.14 | 0.99 | 1 | |
| Index | 0.93 | 0.75 | 1.00 | 0.96 | 0.93 | 0.99 | | 0.84 |
| 2.3 | −1.00 | 0.00 | 0.00 | 0.00 | 0.16 | 0.99 | 2 | |
| Index | 1.00 | 1.00 | 1.00 | 1.00 | 0.94 | 0.99 | | 0.91 |
| 1.4 | 0.00 | 1.00 | 0.00 | 0.00 | 0.00 | 1.00 | | |
| 2.4 | 0.00 | 1.00 | 0.00 | 0.00 | 0.00 | 1.00 | 1 | |
| Index | 1.00 | 1.00 | 1.00 | 1.00 | 1.00 | 1.00 | | 0.95 |
| 2.4 | 0.00 | 1.00 | 0.00 | 0.00 | 0.00 | 1.00 | | |
| Index | 1.00 | 1.00 | 1.00 | 1.00 | 1.00 | 1.00 | 2 | 1.00 |
| 1.5 | 0.00 | 1.00 | 0.00 | 0.00 | 0.00 | 1.00 | | |
| 2.5 | 0.00 | 1.00 | 0.00 | 0.00 | 0.00 | 1.00 | 1 | |
| Index | 1.00 | 1.00 | 1.00 | 1.00 | 1.00 | 1.00 | | 1.00 |
| 2.5 | 0.00 | 1.00 | 0.00 | 0.00 | 0.00 | 1.00 | 1 | |
| Index | 1.00 | 1.00 | 1.00 | 1.00 | 1.00 | 1.00 | | 0.98 |
| 1.6 | 0.00 | 1.00 | 0.00 | 0.00 | 0.00 | 1.00 | | |
| 2.6 | 0.00 | 1.00 | 0.00 | 0.00 | 0.00 | 1.00 | 1 | |
| Index | 1.00 | 1.00 | 1.00 | 1.00 | 1.00 | 1.00 | | 0.92 |
| 2.6 | 0.00 | 1.00 | 0.00 | 0.00 | 0.00 | 1.00 | 2 | |
| Index | 1.00 | 1.00 | 1.00 | 1.00 | 1.00 | 1.00 | | 1.00 |
| 1.7 | 0.00 | 1.00 | 0.00 | −1.00 | 0.00 | 0.00 | | |
| 2.7 | 0.00 | 1.00 | 0.00 | −1.00 | 0.00 | 0.00 | 1 | |
| Index | 1.00 | 1.00 | 1.00 | 1.00 | 1.00 | 1.00 | | 1.00 |
| 2.8 | 1.00 | 0.00 | 0.00 | 0.00 | 1.00 | 0.00 | 1 | |
| Index | 0.50 | 0.50 | 1.00 | 0.46 | 0.50 | 1.00 | | 0.81 |
| 2.15 | 0.00 | 1.00 | 0.00 | −1.00 | 0.00 | 0.00 | 1 | |
| Index | 1.00 | 1.00 | 1.00 | 1.00 | 1.00 | 1.00 | | 0.91 |
| 2.16 | 1.00 | 0.00 | 0.00 | 0.00 | 1.00 | 0.00 | 1 | |
| Index | 0.50 | 0.50 | 1.00 | 0.46 | 0.50 | 1.00 | | 0.76 |
| 1.7 | 0.00 | 1.00 | 0.00 | −1.00 | 0.00 | 0.00 | | |
| 2.7 | 0.50 | −0.87 | 0.00 | 0.87 | 0.50 | 0.00 | 2 | |
| Index | 0.75 | 0.07 | 1.00 | 0.00 | 0.75 | 1.00 | | 0.75 |
| 2.8 | −0.87 | −0.50 | 0.00 | 0.50 | −0.87 | 0.00 | 2 | |
| Index | 0.57 | 0.25 | 1.00 | 0.20 | 0.57 | 1.00 | | 0.75 |
| 2.15 | 0.50 | −0.87 | 0.00 | 0.87 | 0.50 | 0.00 | 2 | |
| Index | 0.75 | 0.07 | 1.00 | 0.00 | 0.75 | 1.00 | | 0.70 |
| 2.16 | −0.87 | −0.50 | 0.00 | 0.50 | −0.87 | 0.00 | 2 | |
| Index | 0.57 | 0.25 | 1.00 | 0.20 | 0.57 | 1.00 | | 0.70 |
| 1.8 | 1.00 | 0.00 | 0.00 | 0.00 | 1.00 | 0.00 | | |
| 2.7 | 0.00 | 1.00 | 0.00 | −1.00 | 0.00 | 0.00 | 1 | |
| Index | 0.50 | 0.50 | 1.00 | 0.46 | 0.50 | 1.00 | | 0.77 |
| 2.8 | 1.00 | 0.00 | 0.00 | 0.00 | 1.00 | 0.00 | 1 | |
| Index | 1.00 | 1.00 | 1.00 | 1.00 | 1.00 | 1.00 | | 1.00 |
| 2.15 | 0.00 | 1.00 | 0.00 | −1.00 | 0.00 | 0.00 | 1 | |
| Index | 0.50 | 0.50 | 1.00 | 0.46 | 0.50 | 1.00 | | 0.76 |
| 2.16 | 1.00 | 0.00 | 0.00 | 0.00 | 1.00 | 0.00 | 1 | |
| Index | 1.00 | 1.00 | 1.00 | 1.00 | 1.00 | 1.00 | | 0.95 |
| 1.8 | 1.00 | 0.00 | 0.00 | 0.00 | 1.00 | 0.00 | | |
| 2.7 | 0.50 | −0.87 | 0.00 | 0.87 | 0.50 | 0.00 | 2 | |
| Index | 0.75 | 0.57 | 1.00 | 0.54 | 0.75 | 1.00 | | 0.82 |
| 2.8 | −0.87 | −0.50 | 0.00 | 0.50 | −0.87 | 0.00 | 2 | |
| Index | 0.07 | 0.75 | 1.00 | 0.73 | 0.07 | 1.00 | | 0.76 |
| 2.15 | 0.50 | −0.87 | 0.00 | 0.87 | 0.50 | 0.00 | 2 | |
| Index | 0.75 | 0.57 | 1.00 | 0.54 | 0.75 | 1.00 | | 0.78 |
| 2.16 | −0.87 | −0.50 | 0.00 | 0.50 | −0.87 | 0.00 | 2 | |
| Index | 0.07 | 0.75 | 1.00 | 0.73 | 0.07 | 1.00 | | 0.70 |

TABLE 5-continued

Results cleaned after pairing and reconciliation of 3D models (not final):

| | | | | | | | | |
|---|---|---|---|---|---|---|---|---|
| 1.9 | 0.00 | 1.00 | 0.00 | −1.00 | 0.00 | 0.00 | | |
| 2.9 | 0.00 | 1.00 | 0.00 | −1.00 | 0.00 | 0.00 | 1 | |
| Index | 1.00 | 1.00 | 1.00 | 1.00 | 1.00 | 1.00 | | 1.00 |
| 2.15 | 0.00 | 1.00 | 0.00 | −1.00 | 0.00 | 0.00 | 1 | |
| Index | 1.00 | 1.00 | 1.00 | 1.00 | 1.00 | 1.00 | | 0.95 |
| 2.9 | 0.50 | −0.87 | 0.00 | 0.87 | 0.50 | 0.00 | 2 | |
| Index | 0.75 | 0.07 | 1.00 | 0.00 | 0.75 | 1.00 | | 0.75 |
| 2.15 | 0.50 | −0.87 | 0.00 | 0.87 | 0.50 | 0.00 | 2 | |
| Index | 0.75 | 0.07 | 1.00 | 0.00 | 0.75 | 1.00 | | 0.71 |
| 1.10 | 0.00 | 0.00 | −1.00 | −0.82 | −0.58 | 0.00 | | |
| 2.10 | −0.07 | −0.99 | −0.14 | 0.02 | 0.14 | −0.99 | 1 | |
| Index | 0.97 | 0.51 | 0.57 | 0.55 | 0.64 | 0.51 | | 0.71 |
| 2.10 | 0.54 | −0.89 | −0.14 | −0.05 | 0.13 | −0.99 | 2 | |
| Index | 0.73 | 0.56 | 0.57 | 0.59 | 0.65 | 0.51 | | 0.69 |
| 1.11 | 0.00 | −0.15 | −0.99 | −1.00 | 0.00 | 0.00 | | |
| 2.11 | −0.04 | −0.08 | −1.00 | −0.87 | 0.50 | 0.00 | 1 | |
| Index | 0.98 | 0.96 | 1.00 | 0.93 | 0.75 | 1.00 | | 0.86 |
| 2.13 | −0.04 | −0.08 | −1.00 | −0.87 | 0.50 | 0.00 | 1 | |
| Index | 0.98 | 0.96 | 1.00 | 0.93 | 0.75 | 1.00 | | 0.85 |
| 2.11 | 0.00 | −0.09 | −1.00 | −1.00 | 0.00 | 0.00 | 2 | |
| Index | 1.00 | 0.97 | 1.00 | 1.00 | 1.00 | 1.00 | | 0.98 |
| 2.13 | 0.00 | −0.09 | −1.00 | −1.00 | 0.00 | 0.00 | 2 | |
| Index | 1.00 | 0.97 | 1.00 | 1.00 | 1.00 | 1.00 | | 0.96 |
| 1.12 | 0.00 | −1.00 | 0.07 | 0.00 | −0.07 | −1.00 | | |
| 2.12 | −0.50 | −0.86 | 0.07 | −0.03 | −0.06 | −1.00 | 1 | |
| Index | 0.75 | 0.93 | 1.00 | 0.98 | 1.00 | 1.00 | | 0.85 |
| 2.12 | 0.00 | −1.00 | 0.07 | 0.00 | −0.07 | −1.00 | 2 | |
| Index | 1.00 | 1.00 | 1.00 | 1.00 | 1.00 | 1.00 | | 1.00 |
| 1.13 | 0.00 | −0.15 | −0.99 | −1.00 | 0.00 | 0.00 | | |
| 2.11 | −0.04 | −0.08 | −1.00 | −0.87 | 0.50 | 0.00 | 1 | |
| Index | 0.98 | 0.96 | 1.00 | 0.93 | 0.75 | 1.00 | | 0.87 |
| 2.13 | −0.04 | −0.08 | −1.00 | −0.87 | 0.50 | 0.00 | 1 | |
| Index | 0.98 | 0.96 | 1.00 | 0.93 | 0.75 | 1.00 | | 0.88 |
| 2.11 | 0.00 | −0.09 | −1.00 | −1.00 | 0.00 | 0.00 | 2 | |
| Index | 1.00 | 0.97 | 1.00 | 1.00 | 1.00 | 1.00 | | 0.96 |
| 2.13 | 0.00 | −0.09 | −1.00 | −1.00 | 0.00 | 0.00 | 2 | |
| Index | 1.00 | 0.97 | 1.00 | 1.00 | 1.00 | 1.00 | | 0.98 |
| 1.14 | 0.00 | 0.00 | −1.00 | −0.82 | 0.58 | 0.00 | | |
| 2.10 | −0.07 | −0.99 | −0.14 | 0.02 | 0.14 | −0.99 | 1 | |
| Index | 0.97 | 0.51 | 0.57 | 0.55 | 0.78 | 0.51 | | 0.78 |
| 2.10 | 0.54 | −0.89 | −0.14 | −0.05 | 0.13 | −0.99 | 2 | |
| Index | 0.73 | 0.56 | 0.57 | 0.59 | 0.78 | 0.51 | | 0.77 |
| 1.15 | 0.00 | 1.00 | 0.00 | −1.00 | 0.00 | 0.00 | | |
| 2.9 | 0.00 | 1.00 | 0.00 | −1.00 | 0.00 | 0.00 | 1 | |
| Index | 1.00 | 1.00 | 1.00 | 1.00 | 1.00 | 1.00 | | 0.95 |
| 2.15 | 0.00 | 1.00 | 0.00 | −1.00 | 0.00 | 0.00 | 1 | |
| Index | 1.00 | 1.00 | 1.00 | 1.00 | 1.00 | 1.00 | | 1.00 |
| 2.9 | 0.50 | −0.87 | 0.00 | 0.87 | 0.50 | 0.00 | 2 | |
| Index | 0.75 | 0.07 | 1.00 | 0.00 | 0.75 | 1.00 | | 0.73 |
| 2.15 | 0.50 | −0.87 | 0.00 | 0.87 | 0.50 | 0.00 | 2 | |
| Index | 0.75 | 0.07 | 1.00 | 0.00 | 0.75 | 1.00 | | 0.75 |
| 2.8 | 1.00 | 0.00 | 0.00 | 0.00 | 1.00 | 0.00 | 1 | |
| Index | 1.00 | 1.00 | 1.00 | 1.00 | 1.00 | 1.00 | | 0.95 |
| 2.16 | 1.00 | 0.00 | 0.00 | 0.00 | 1.00 | 0.00 | 1 | |
| Index | 1.00 | 1.00 | 1.00 | 1.00 | 1.00 | 1.00 | | 1.00 |
| 2.17 | 0.00 | 1.00 | 0.00 | −1.00 | 0.00 | 0.00 | 1 | |
| Index | 0.50 | 0.50 | 1.00 | 0.46 | 0.50 | 1.00 | | 0.83 |
| 2.7 | 0.00 | 1.00 | 0.00 | −1.00 | 0.00 | 0.00 | 2 | |
| Index | 0.50 | 0.50 | 1.00 | 0.46 | 0.50 | 1.00 | | 0.75 |
| 2.8 | 1.00 | 0.00 | 0.00 | 0.00 | 1.00 | 0.00 | 2 | |
| Index | 1.00 | 1.00 | 1.00 | 1.00 | 1.00 | 1.00 | | 0.95 |
| 2.16 | −0.87 | −0.50 | 0.00 | 0.50 | −0.87 | 0.00 | 2 | |
| Index | 0.07 | 0.75 | 1.00 | 0.73 | 0.07 | 1.00 | | 0.75 |
| 2.17 | 0.50 | −0.87 | 0.00 | 0.87 | 0.50 | 0.00 | 2 | |
| Index | 0.75 | 0.57 | 1.00 | 0.54 | 0.75 | 1.00 | | 0.82 |
| 1.18 | 0.00 | 0.00 | 1.00 | 0.00 | −1.00 | 0.00 | | |
| 2.18 | 0.00 | 0.00 | 1.00 | 0.00 | −1.00 | 0.00 | 1 | |
| Index | 1.00 | 1.00 | 1.00 | 1.00 | 1.00 | 1.00 | | 1.00 |
| 2.18 | 0.00 | 0.00 | −1.00 | −0.50 | 0.87 | 0.00 | 2 | |
| Index | 1.00 | 1.00 | 0.00 | 0.73 | 0.07 | 1.00 | | 0.74 |

The invention claimed is:

1. A computer implemented method to display a reference 3D model and more than one other 3D models in the form of a 3D scene, the 3D scene including the reference 3D model and a plurality of the more than one other 3D models, the method comprising:
   selecting 3D models to be displayed from the more than one other 3D models according to one or more criteria;

comparing faces of each of the selected 3D models with corresponding faces of the reference 3D model according to the one or more criteria;

computing a similarity index resulting from the comparison;

computing a spatial position for each of the selected 3D models relative to the reference 3D model in the 3D scene based on the similarity index;

displaying the reference 3D model and the selected 3D models at their respective computed spatial position in the 3D scene on a display unit; and marking each of the faces of the selected 3D models according to their respective similarity index.

2. The method of claim 1), further comprising the step of constraining the marking of each of the faces of the selected 3D models with regard to the corresponding faces of the reference 3D model in the 3D scene according to the one or more criteria.

3. The method of claim 1), wherein at least one of the marked faces is displayed at least on one of the displayed 3D models.

4. The method of claim 1), further comprising marking each of the displayed faces according to a similarity type issued from the one or more criteria.

5. The method of claim 1), wherein the spatial position for each of the selected 3D models is further computed based on one or a plurality of non-geometric information.

6. The method of claim 1), the method further comprising displaying unselected 3D models in the 3D scene in the display unit.

7. The method of claim 1), wherein similarities and/or differences are displayed on sub sets of the selected 3D models.

8. The method of claim 1), wherein the markings on each of the faces of the selected 3D models represent one or a plurality of non-geometric information.

9. The method of claim 1), the similarity index corresponding to similarities or differences between the faces of each of the selected 3D models and the corresponding faces of the reference 3D model.

10. The method of claim 1), the similarity index corresponding to similarities and differences between the faces of each of the selected 3D models and the corresponding faces of the reference 3D model.

11. The method of claim 1), the computing of the spatial positioning of the selected 3D models being based on the highest similarity index.

* * * * *